(12) United States Patent
Han

(10) Patent No.: US 11,837,503 B2
(45) Date of Patent: *Dec. 5, 2023

(54) SCALABLE AND FLEXIBLE ARCHITECTURES FOR INTEGRATED CIRCUIT (IC) DESIGN AND FABRICATION

(71) Applicant: ALIBABA GROUP HOLDING LIMITED, Grand Cayman (KY)

(72) Inventor: Wei Han, San Mateo, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 17/650,343

(22) Filed: Feb. 8, 2022

(65) Prior Publication Data

US 2022/0157662 A1    May 19, 2022

Related U.S. Application Data

(63) Continuation of application No. 16/889,304, filed on Jun. 1, 2020, now Pat. No. 11,270,917.

(51) Int. Cl.
*H01L 23/48* (2006.01)
*H01L 21/822* (2006.01)
(Continued)

(52) U.S. Cl.
CPC ...... *H01L 21/8221* (2013.01); *H01L 21/8232* (2013.01); *H01L 23/481* (2013.01); *H01L 21/302* (2013.01)

(58) Field of Classification Search
CPC ............ H01L 21/8221; H01L 21/8232; H01L 23/4012; H01L 23/481; H01L 25/043; H01L 25/0657; H01L 2224/2541
(Continued)

(56) References Cited

U.S. PATENT DOCUMENTS

2003/0148558 A1    8/2003  Kubo et al.
2013/0032952 A1*   2/2013  Cho .................. H01L 25/03
                                                    257/777

OTHER PUBLICATIONS

"High Performance Computing & Big Data" 2.3 : A 220GOPS 96-core Processor with 6 Chiplets 3D-stacked on an Active Interposer Offering 0.6ns/mm Latency, 3TBit/s/mm2 inter-Chiplet Interconnects and 156mW/mm2 @ 82% Peak-Efficiency DC-DC Converters; © 2020 International Solid-State Circuits Conference (19 pgs.).

(Continued)

*Primary Examiner* — Hoai V Pham
(74) *Attorney, Agent, or Firm* — Finnegan, Henderson, Farabow, Garrett & Dunner, LLP

(57) ABSTRACT

The present disclosure relates to a system and a method for fabricating one or more integrated circuits (ICs). The system includes a plurality of logic tiles formed on a logic wafer and separated by at least one first scribe line, a respective logic tile including a function unit including circuitry configured to perform a respective function; at least one global interconnect configured to communicatively connect the plurality of logic tiles; a plurality of memory tiles formed on a memory wafer connected with the logic wafer, the plurality of memory tiles separated by at least one second scribe line that is substantially aligned with the at least one first scribe line, wherein the logic wafer and the memory wafer are diced along the at least one first scribe line and the at least one second scribe line to obtain a plurality of ICs, a respective IC including at least one logic tile connected with at least one memory tile.

19 Claims, 12 Drawing Sheets

(51) Int. Cl.
*H01L 21/8232* (2006.01)
*H01L 21/302* (2006.01)

(58) Field of Classification Search
USPC ........................................... 257/620
See application file for complete search history.

(56) References Cited

OTHER PUBLICATIONS

"2.3 A 220GOPS 96-Core Processor with 6 Chiplets 3D-Stacked on an Active Interposer Offering 0.6ns/mm Latency, 3Tb/s/mm2 Inter-Chiplet Interconnects and 156mW/mm2@ 82%-Peak-Efficiency DC-DC Converters" IEEE © 2020 1International Solid-State Circuits Conference, dated Feb. 17, 2020 (3 pgs.).

* cited by examiner

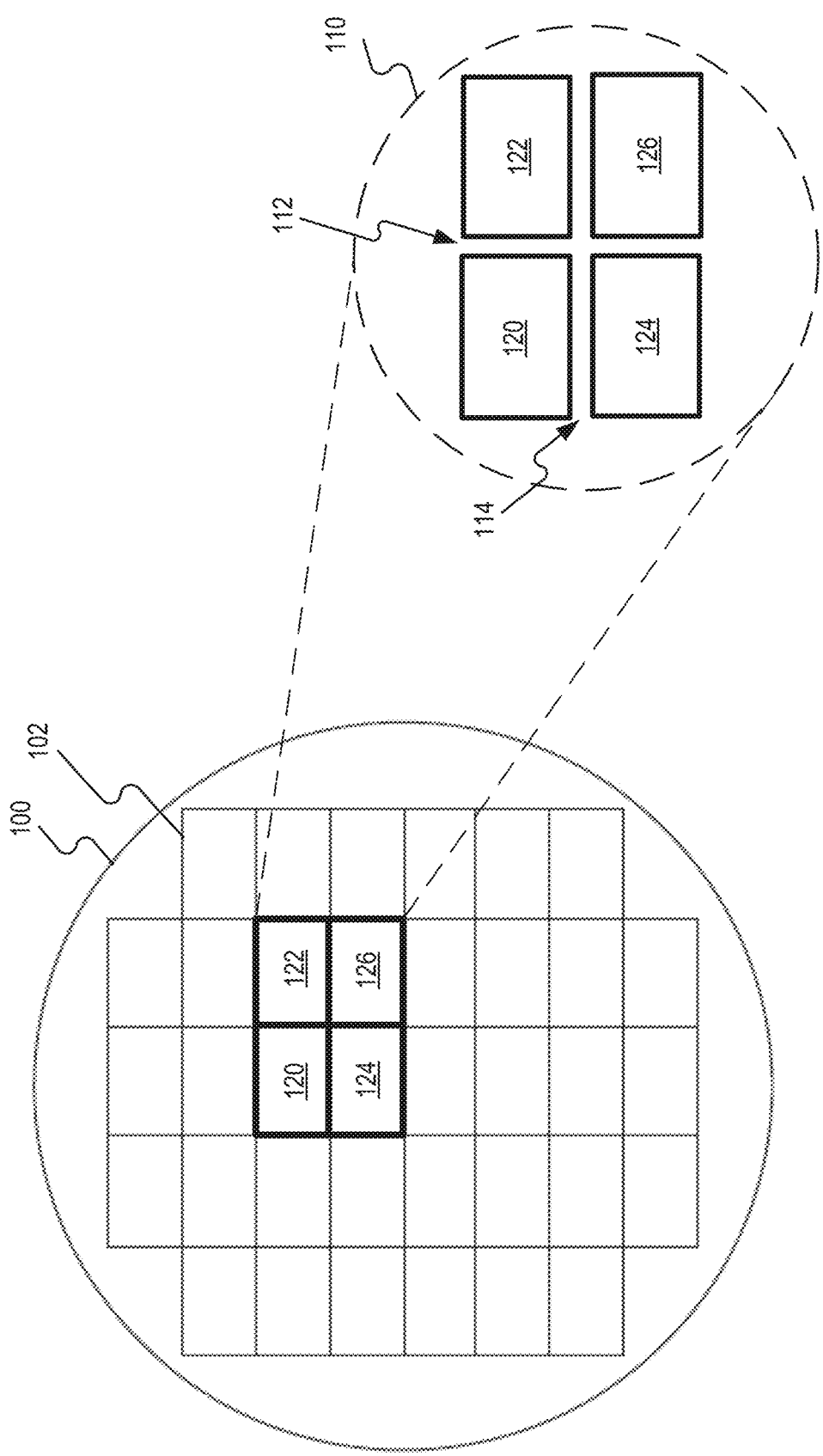

700

705
Dicing a first wafer bonded with a second wafer along at least one first scribe line and at least one second scribe line to obtain one or more integrated circuits (ICs), the one or more ICs including a first integrated circuit (IC) that includes at least one tile of a plurality of tiles from the first wafer bonded with at least one tile of a plurality of tiles from the second wafer

710
The plurality of tiles on the first wafer are separated by the at least one first scribe line, a respective tile of the plurality of tiles on the first wafer including a function unit including circuitry configured to perform a function.

720
The plurality of tiles on the second wafer are separated by at least one second scribe line that is substantially aligned with the at least one first scribe line on the first wafer.

730
At least one global interconnect is formed on the first wafer and configured to communicatively connect the plurality of tiles on the first wafer.

FIG. 7

SCALABLE AND FLEXIBLE ARCHITECTURES FOR INTEGRATED CIRCUIT (IC) DESIGN AND FABRICATION

CROSS REFERENCE TO RELATED APPLICATION

The present application is a continuation of U.S. patent application Ser. No. 16/889,304, filed on Jun. 1, 2020, which is incorporated herein by reference in its entirety.

BACKGROUND

Recent progress in various technological areas, such as artificial intelligence (AI) processors, neural network accelerators, or high definition (HD) video streaming, require electronic systems to have high computing power and low latency in data transmission and processing. Developments have been made in integrated circuit (IC) architecture design and semiconductor fabrication processes. However, performance mismatch between logic units and memory units (e.g., "memory wall") still poses challenges to circuit design, including inefficient data routing and increased power consumption. Further, there are still problems in conventional semiconductor architecture design and fabrication processes, such as high non-recurring engineering (NRE) costs, long production cycles, with high time-to-market pressure.

SUMMARY OF THE DISCLOSURE

Embodiments of the present disclosure provide a system including a plurality of logic tiles formed on a logic wafer and that are separated by at least one first scribe line, a respective logic tile of the plurality of logic tiles including a function unit including circuitry configured to perform a respective function; at least one global interconnect configured to communicatively connect the plurality of logic tiles; a plurality of memory tiles formed on a memory wafer connected with the logic wafer, the plurality of memory tiles separated by at least one second scribe line on the memory wafer that is substantially aligned with the at least one first scribe line on the logic wafer, wherein the logic wafer and the memory wafer are simultaneously diced along the at least one first scribe line and the aligned at least one second scribe line to obtain a plurality of integrated circuits (ICs), a respective integrated circuit (IC) of the plurality of ICs including at least one logic tile connected with at least one memory tile.

Embodiments of the present disclosure provide a system including a logic wafer including a first logic tile and a second logic tile that are separated by at least one first scribe line, the first logic tile including circuitry configured to perform a first function, the second logic tile including circuitry configured perform a second function different from the first function; at least one global interconnect configured to communicatively couple the first logic tile with the second logic tile; and a memory wafer bonded with the logic wafer. The memory wafer includes a plurality of memory tiles separated by at least one second scribe line, the at least one second scribe line substantially aligned with the at least one first scribe line such that the logic wafer bonded with the memory wafer can be diced along the at least one first scribe line and the at least one second scribe line to obtain at least one integrated circuit (IC) including at least one logic tile connected with at least one memory tile.

Embodiments of the present disclosure provide a method for fabricating one or more integrated circuits (ICs). The method includes dicing a logic wafer bonded with a memory wafer along at least one first scribe line and at least one second scribe line to obtain the one or more ICs, the one or more ICs including a first integrated circuit (IC) that includes at least one logic tile of a plurality of logic tiles from the logic wafer connected with at least one memory tile of a plurality of memory tiles from the memory wafer. The plurality of logic tiles on the logic wafer are separated by the at least one first scribe line, a respective logic tile of the plurality of logic tiles on the logic wafer including a function unit including circuitry configured to perform a function. The plurality of memory tiles on the memory wafer are separated by at least one second scribe line that is substantially aligned with the at least one first scribe line on the logic wafer. At least one global interconnect is configured to communicatively connect the plurality of logic tiles on the logic wafer.

Embodiments of the present disclosure provide a computer-readable medium storing a representation of an integrated circuit (IC) system. The IC system includes a plurality of logic tiles formed on a logic wafer and that are separated by at least one first scribe line, a respective logic tile of the plurality of logic tiles including a function unit including circuitry configured to perform a respective function; at least one global interconnect configured to communicatively connect the plurality of logic tiles; a plurality of memory tiles formed on a memory wafer connected with the logic wafer, the plurality of memory tiles separated by at least one second scribe line on the memory wafer that is substantially aligned with the at least one first scribe line on the logic wafer, wherein the logic wafer and the memory wafer are simultaneously diced along the at least one first scribe line and the aligned at least one second scribe line to obtain a plurality of integrated circuits (ICs), a respective IC of the plurality of ICs including at least one logic tile connected with at least one memory tile.

Additional features and advantages of the disclosed embodiments will be set forth in part in the following description, and in part will be apparent from the description, or may be learned by practice of the embodiments. The features and advantages of the disclosed embodiments may be realized and attained by the elements and combinations set forth in the claims.

It is to be understood that both the foregoing general description and the following detailed description are example and explanatory only and are not restrictive of the disclosed embodiments, as claimed.

BRIEF DESCRIPTION OF THE DRAWINGS

FIG. 1A is a block diagram illustrating an example wafer, according to some embodiments of the present disclosure.

FIG. 1B is a block diagram illustrating a magnification showing a magnified view of a subset of tiles of a wafer, according to some embodiments of the present disclosure.

FIG. 7 illustrates a flowchart of an exemplary method for fabricating one or more integrated circuits (ICs) based on scalable architectures, according to some embodiments of the present disclosure.

DETAILED DESCRIPTION

Figure 1C:
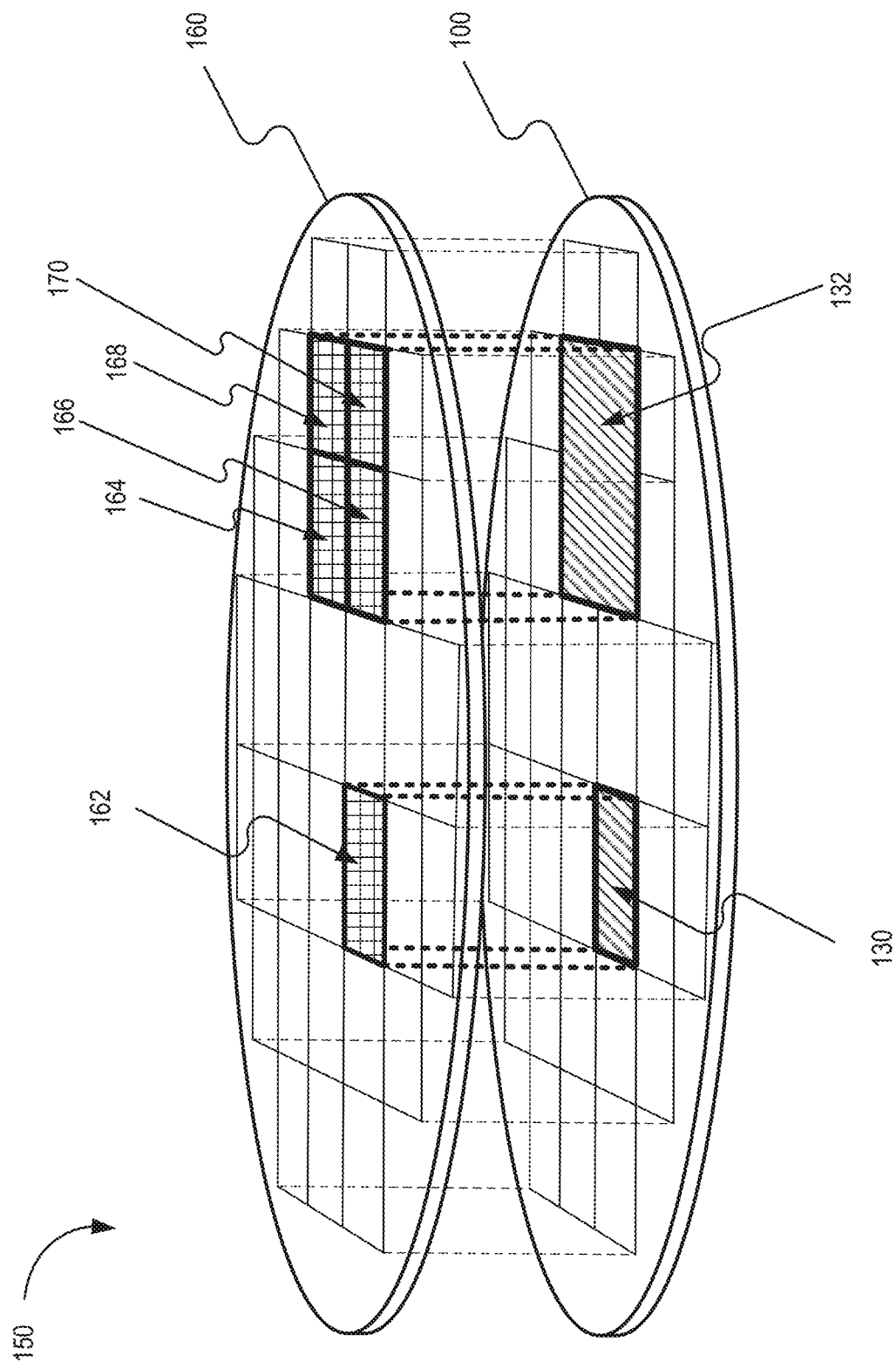
FIG. 1C is an example diagram illustrating a 3D wafer-to-wafer bonding stack with scalable architectures for integrated circuits (ICs), according to some embodiments of the present disclosure.

Reference will now be made in detail to example embodiments, examples of which are illustrated in the accompanying drawings. The following description refers to the accompanying drawings in which the same numbers in different drawings represent the same or similar elements unless otherwise represented. The implementations set forth in the following description of example embodiments do not represent all implementations consistent with the invention. Instead, they are merely examples of apparatuses and methods consistent with aspects related to the invention as recited in the appended claims.

Three-dimensional (3D) stacked integration technology can form integrated circuits (ICs) (e.g., system-on-chips (SoCs)) with high performance by vertically stacking multiple layers, such as dies, tiles, chip, wafers, or combinations thereof. In some embodiments, 3D stacked integration technology may include wafer-to-wafer bonding, die-to-die bonding, die-to-wafer integration, 3D packaging including system-in-package (SiP), etc. The multiple layers may be made from different materials and connected using one or more suitable bonding technologies, such as wire bonding, flip-chip bonding, oxide-to-oxide bonding, metal bonding (e.g., copper-to-copper bonding), adhesive bonding (e.g., polymer bonding), hybrid bonding (e.g., metal/adhesive redistribution layer bonding), and through-silicon vias (TSVs).

3D wafer-to-wafer integration processes may include wafer-to-wafer alignment, bonding, thinning, interconnecting, and dicing to form individual IC chips or SoCs. 3D wafer-to-wafer integration technology can provide numerous benefits such as enhanced data transmission speed, reduced power consumption, smaller form factor, reduced packaging, and improved device performance. Further, IC devices and systems made from 3D stacked integration can be used in various technological fields such as machine learning, deep learning, and cloud computing for artificial intelligence accelerators or video transcoding.

Sometimes the design and manufacturing processes for 3D integration technology, such as 3D wafer-to-wafer bonding, can be time-consuming and expensive, resulting in a lower yield rate than normal processes. For example, IC devices and systems for different applications may have different requirements for hardware. Sometimes any change to the IC architectures, e.g., for different products or different markets, may result in redesign of the IC layout, adjustment of the fabrication tools and processes, and reenter the foundry for production. These processes may cause high non-recurring engineering (NRE) cost for redesign and fabrication and long production cycle with high time-to-market pressure.

Further, the size of dies on a first wafer (e.g., logic dies on a logic wafer) may be restricted to the size of dies on a second wafer (e.g., memory dies on a memory wafer). The scalability of the design and fabrication may be limited. For example, the dimensions of the IC chips used for SoCs are fixed and cannot be scaled up or down without going back to change the layout design. In addition, different designs of IC architectures for one wafer architecture may not fit in one layout design file (e.g., a Graphic Database System (GDS) or GDSII file). As a result, sometimes significant areas on the wafer may be wasted. The present disclosure presents solutions to address these problems.

FIG. 1A is a block diagram illustrating an example wafer 100, according to some embodiments of the present disclosure. In some embodiments, wafer 100 is a semiconductor wafer. In some embodiments, wafer 100 can include any suitable type of wafer substrate, such as silicon (Si), germanium (Ge), carbon (C), silicon carbide (SiC), silicon on insulator (SOI), fused silica, quartz, ceramics, gallium nitride (GaN), gallium arsenide (GaAs), gallium phosphide (GaP), gallium indium nitride (GaInN), cadmium selenide (CdSe), zinc sulfide (ZnS), laminate substrates, glass, or organic semiconductor substrates.

As shown in FIG. 1A, wafer 100 includes a plurality of tiles 102. In some embodiments, tiles 102 can represent areas corresponding to dies, chips, units, pieces, blocks, or other suitable structures on wafer 100. As would be understood by one of ordinary skill in the art, an IC or a SoC can encompass the entirety of the area represented by each of tiles 102 or some smaller amount of area of each of tiles 102.

FIG. 1B is a block diagram illustrating a magnification 110 showing a magnified view of a subset of tiles 102, including tiles 120, 122, 124, and 126, according to some embodiments of the present disclosure. Although only tiles 120, 122, 124, and 126 are shown in magnification 110, it is understood that there are additional tiles 102 surrounding these tiles. Magnification 110 shows spacing between tiles 120, 122, 124, and 126. These spaces or delineations between the tiles are called scribe lines and typically define where the wafer will be cut (e.g., diced) to separate tiles 102.

As shown in magnification 110, a scribe line 114 runs horizontally across wafer 100 defining the boundary between tiles 120 and 122 and tiles 124 and 126. A scribe line 112 runs vertically across wafer 100 defining the boundary between tiles 120 and 124 and tiles 122 and 126. Scribe lines 112 and 114 define where wafer 100 will later be cut during fabrication. In some embodiments, the components of tiles 102 do not generally overlap with scribe lines 112 and 114, and some space may be placed between the scribe lines and components of tiles 102.

In some embodiments as shown in FIGS. 1A-1B, wafer 100 is a logic wafer including a plurality of logic tiles 102 (e.g., dies, chips, units, pieces, blocks) that are repeating units on wafer 100 with identical dimensions. In some embodiments, all logic tiles 102 include the same circuits and devices configured to perform identical functions. In some other embodiments, logic tiles 102 include different circuits and devices from each other to support different computing functions as needed. For example, a respective logic tile 102 may be a modular unit (e.g., a building block) on wafer 100 that includes a plurality of interconnected IC devices configured to support certain computing functions including, but not limited to, general computing, machine learning, artificial intelligence (AI) accelerator, edge computing, cloud computing, video codec (e.g., compression or decompression), or video transcoding.

FIG. 1C is an example diagram illustrating 3D wafer-to-wafer bonding stack 150 (e.g., wafer stack 150) with scalable architectures for ICs, according to some embodiments of the present disclosure. As discussed herein, 3D wafer-to-wafer bonding can help electronics designers with optimizing routing, cutting power consumption, and shrinking memory footprint by going vertical. As shown in FIG. 1C, in 3D wafer-to-wafer bonding, two or more wafers are stacked vertically. For example, a memory wafer 160 as discussed in FIGS. 1A-1B is stacked on logic wafer 100. In some embodiments, memory wafer 160 includes dynamic random access memory (DRAM) array cells. In some embodiments, memory wafer 160 can also include other types of memories, such as NAND flash memory, static random access memory (SRAM), ferroelectric random access memory (FRAM), magnetoresistive random-access memory (MRAM), or phase change memory.

In some embodiments, memory wafer 160, e.g., a DRAM wafer, includes scribe lines that define where memory wafer 160 will be cut to separate memory tiles 162 (e.g., dies, chips, units, pieces, blocks). In some embodiments, memory wafer 160 and logic wafer 100 for 3D bonding have the same dimension. For example, each wafer has a diameter of 25 mm, 51 mm, 76 mm, 100 mm, 125 mm, 150 mm, 200 mm, 300 mm, 450 mm, or 675 mm. In some embodiments, a respective memory tile 162 includes one or more sets of DRAM array cells corresponding to a certain storage size. For example, a memory tile 162 may have a dimension of 16 mm$^2$ corresponding to a storage size of 128 MB. Memory tile 162 can also have other dimension configured to provide other suitable storage sizes such as 256 MB, 512 MB, 1 GB, 2 GB, 4 GB, 16 GB, or other storage capacities for various devices.

In some embodiments, during stacking and bonding, scribe lines on logic wafer 100 are substantially aligned to match scribe lines on memory wafer 160 (e.g., with a mismatch error margin of 0-100 μm), such that during dicing, logic wafer 100 and memory wafer 160 can be diced along the respective scribe lines to obtain one or more ICs. In some embodiments as shown in FIG. 1C, one IC may include one logic tile, e.g., logic tile 130, bonded with one corresponding memory tile, e.g., memory tile 162. In some embodiments, a logic tile (e.g., logic tile 130) of logic wafer 100 has a substantially similar size as a memory tile (e.g., memory tile 162) of memory wafer 160, e.g., with an area of 16 mm$^2$±2 mm$^2$. In some embodiments, one IC may include one logic tile, e.g., logic tile 132, bonded with a plurality of corresponding memory tiles, e.g., memory tiles 164, 166, 168, and 170. In this case, a logic tile (e.g., logic tile 132) may have a size corresponding to four memory tiles, e.g., 64 mm$^2$±5 mm$^2$. As such, one logic tile may correspond to any number of memory tiles in accordance with the need of computing power and storage capacity from the IC devices. It is appreciated that a memory tile may have any other suitable size, and a logic tile may have a similar size as the memory tile or a size of a multiplication of an integer (e.g., depending on how many logic tiles correspond to a memory tile for an IC).

In some embodiments, logic wafer 100 and memory wafer 160 can be aligned and bonded using any suitable technology including but not limited to metal bonding (e.g., copper-to-copper bonding), adhesive bonding (e.g., polymer bonding), hybrid bonding (e.g., metal/adhesive redistribution layer bonding), and through-silicon vias (TSVs). After the bonding process, a plurality of ICs (e.g., such as system-on-chips (SoCs)) can be obtained by dicing along the scribe lines on both wafers. As such, a respective IC used for a device or system may be scalable in various shapes and sizes via flexible dicing to include a single IC block (e.g., a logic tile stacked on a memory tile) or multiple IC blocks that are interconnected to provide one or more functions. For example, an IC device or system may contain a single IC block including memory tile 162 stacked on and bonded with logic tile 130 to provide functions supported by IC of logic tile 130. In another example, an IC device or system may include multiple IC blocks, such as memory tiles 164, 166, 168, and 170 stacked and bonded with logic tile 132.

Figure 1E:
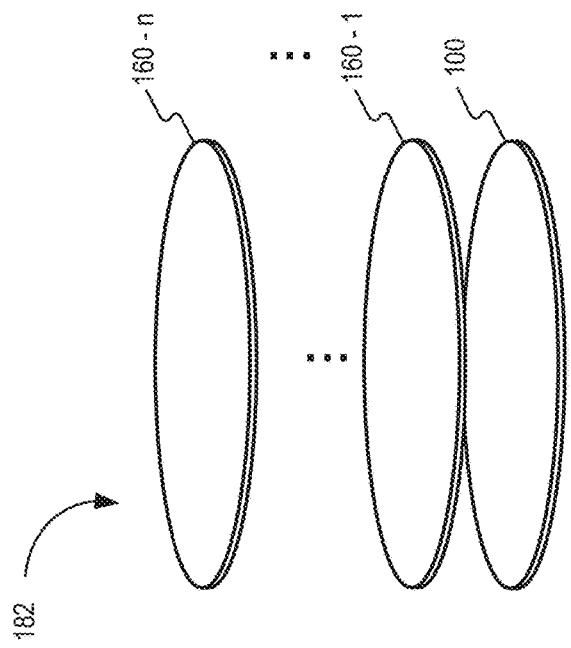
FIGS. 1D-1F are example diagrams illustrating various wafer-to-wafer bonding stacks with scalable architectures for ICs, according to some embodiments of the present disclosure.
Figure 1D:
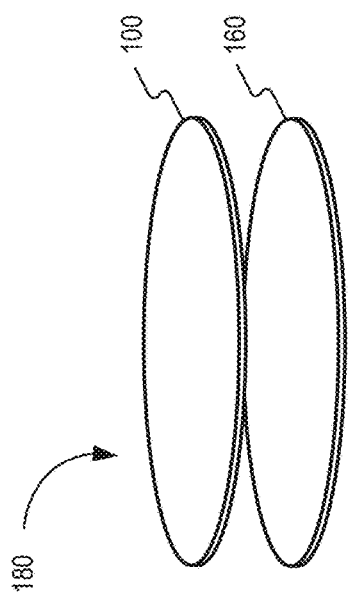
Figure 1F:
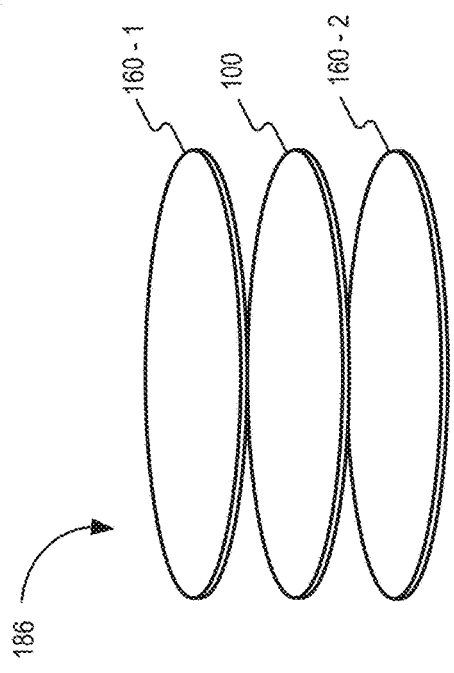

FIGS. 1D-1F are example diagrams illustrating various 3D wafer-to-wafer bonding stacks 180, 182, and 184 (e.g., wafer stacks 180, 182, and 184) respectively with scalable architectures for ICs, according to some embodiments of the present disclosure. For example, as shown in FIG. 1D, wafer stack 180 includes logic wafer 100 stacked on memory wafer 160. As shown in FIG. 1E, wafer stack 182 includes more than one memory wafer, e.g., wafer 160-1 . . . 160-n, stacked on logic wafer 100. Further as shown in FIG. 1F, a sandwich structure 186 including a logic wafer 100 placed between a first memory wafer 160-1 and a second memory wafer 160-2 can be formed. It is appreciated that FIGS. 1C-1F are examples for illustration purpose. Any other suitable bonding stacks can be used and are included within the scope of the present disclosure.

Figure 2A:
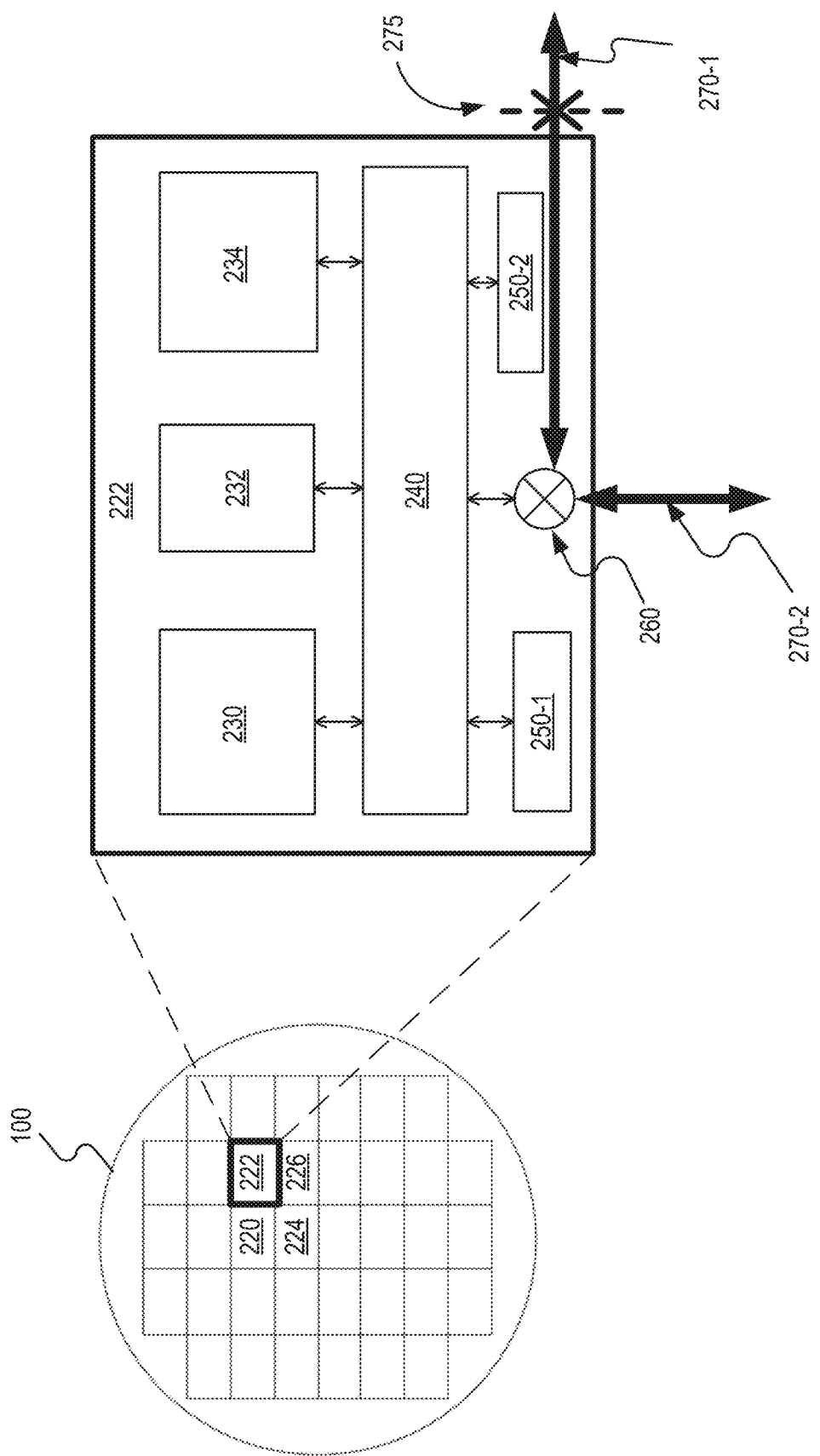
FIG. 2A is a block diagram illustrating a plurality of tiles included in a logic wafer with scalable architectures, according to some embodiments of the present disclosure

FIG. 2A is a block diagram illustrating an example logic tile 222 of a plurality of tiles included in logic wafer 100 with scalable architectures, according to some embodiments of the present disclosure. It is appreciated that tile 222 can be the same as any of tile 102, 120, 122, 124, 126, and 130 of FIGS. 1A-1F or it can be any other tile on logic wafer 100. In some embodiments, logic tile 222 alone can be used in an IC device. In some other embodiments, logic tile 222 can be stacked and bonded with one or more memory tiles (as discussed in FIG. 1C) to be used in an IC device. In some embodiments, logic tile 222 may be soldered on, plugged into a socket, or via any other suitable method to be integrated in the IC device.

As shown in FIG. 2A, logic tile 222 includes a function unit 230, a processor unit 232, a peripheral unit 234, one or more memory controllers 250-1, 250-2 that are interconnected via an internal connection unit 240. In some embodiments, logic tile 222 further includes a switch 260 coupled to an external connection unit 270 to provide channels for exchanging signals or data with external components, such as other tiles (e.g., logic tiles 220, 224, 226) on the same wafer 100, or ICs on another wafer, such as memory tile(s) on memory wafer 160 in FIG. 1C. In some embodiments, these hardware components may be integrated into logic tile 222 as a single chip (e.g., an IC or a SoC). It is appreciated that logic tile 222 illustrated in FIG. 2A is an example and is not to be limiting. It is appreciated that logic tile 222 can have any type of individual chip system, including any number of components with any suitable functions, such as imaging processing, wireless or wired communication.

Function unit 230 includes hardware components implemented with software systems thereon to perform function(s) provided by tile 222 to the corresponding IC device. For example, when tile 222 is used for AI computing in the IC device, function unit 230 may be a deep learning unit (DPL) including one or more deep learning processing elements (DPEs) configured to support a deep learning engine for the IC device. In some embodiments, function unit 312 includes artificial intelligence ("AI") training processors, AI training chips, neural processing units ("NPU"), deep learning units (DPU), or graphic processing units ("GPU").

In some other examples, tile 222 can be used for video processing, such as video compression, decompression, or transcoding. Function unit 230 may include chips supporting video coding functions (e.g., high efficiency video coding (HEVC)). More details of function unit 230 will be discussed in example IC systems in FIGS. 3A, 4, and 5 below.

Processor unit 232 may be implemented as a Central Processing Unit (CPU). In some embodiments, processor unit 232 can have one or more cores. With the computation provided by the one or more processor cores, processor unit 232 may execute a full-blown operating system for the device. In some embodiments, processor unit 232 including circuitry configured to execute instructions to support various functions, e.g., arithmetic, logic, controlling, and input/output (I/O) operations.

Peripheral unit 234 may include hardware device that support data communication. For example, peripheral unit 234 may include chip interface such as inter-IC bus (I2C) bus, inter-IC sound (I2S), serial peripheral interface (SPI), and universal asynchronous receiver-transmitter (UART). Peripheral unit 234 may also include software interface for implementing peripheral communication protocol. For example, peripheral unit 234 may include a PCIe core to facilitate communication between tile 222 and other tiles or systems according to PCIe protocols.

Memory controller(s) 250 may control memories to facilitate the functionality of processor unit 232. For example, memory controller(s) 250 may facilitate or control access of data stored on local memory units (e.g., memories on logic tile 222) by processor unit 232. Memory controller(s) 250 may also control memory locations on another tile or in another system (e.g., memories on corresponding memory tile(s) bonded with logic tile 222) that is in communication with tile 222 and facilitate the data transmission therebetween.

Internal connection unit 240 may include a local network-on-chip (NoC), which may provide a high-speed on-chip interconnect that connects together the various hardware components on tile 222. For example, data, messages, interrupts, signals, or the like can be communicated among the components of tile 222 via local NoC 240 as shown in FIG. 2A. It is appreciated that local NoC 240 can be replaced by other kinds of internal buses.

Switch 260 may include circuitry configured for routing traffic along global connections between tiles. In some embodiments, switch 260 includes a multiplexer including circuitry configured to switch one of multiple input lines (or channels) one at a time through to a single common output line using a control signal. Switch 260 may include digital circuits made from high speed logic gates used to switch digital or binary data. Switch 260 may also be analogue types using transistors, such as metal-oxide-semiconductor field-effect transistors (MOSFETs), or relays to switch one of the voltage or current inputs through to a single output.

External connection unit 270 may include a global network-on-chip (NoC) connected to switch 260. Global NoC may provide a high-speed on-chip interconnect that connects together various hardware components between multiple logic tiles on logic wafer 100. That is, while local NoC 240 may facilitate data or signal communication within tile 222, global NoC 270 may facilitate data or signal communication between tiles, such as between tile 222 and tile 220, 224, or 226 as shown in FIG. 2A. In some embodiments, global NoC 270 may use top level metals e.g. layers 8 or 9 of 9 metal layers on tile 222. As such, global NoC 270-1 can be cut off during wafer dicing 275 on logic wafer 222 to obtain corresponding logic tiles without affecting the functionality and connection within logic tile 222 itself, or the functionality and connection between tile 222 and other tile(s) (e.g., tile 226) via global NoC 270-2. As described herein, the global NoC in the logic wafer uses the top metal layers, so that the structures in the present disclosure can be used for a bigger chip with multiple titles, and further can be cut without affecting the functionalities of individual group of tiles.

Figure 2B:
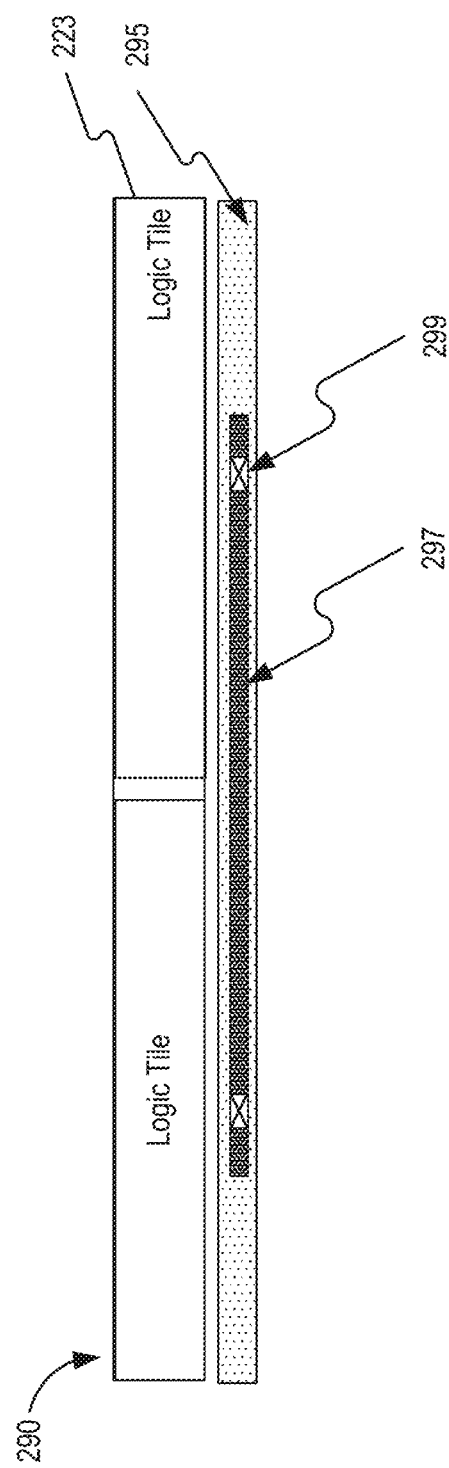
FIG. 2B is a block diagram illustrating a cross-section view including a global network-on-chip (NoC) and a switch formed on an interposer below a logic wafer, according to some embodiments of the present disclosure.

Although switch 260 and external connection unit 270 are illustrated in FIG. 2A as formed on logic tile 222, in some embodiments, switch 260 and external connection unit 270 can also be formed on another structure within a 3D wafer-to-wafer stacking structure. For example, FIG. 2B is a block diagram 290 illustrating a cross-section view including a global network-on-chip (NoC) 297 and a switch 299 formed in an interposer layer 295 below a logic wafer 223, according to some embodiments of the present disclosure. Interposer layer 295 may be an electrical interface routing between logic tiles on logic wafer 223. Interposer layer 295 may include silicon (Si), polymer, glass, or any other suitable material. As shown in FIG. 2B, switch 299 and global NoC 297 can be formed in interposer layer 295 as an active interposer. As such, the local NoC (e.g., local NoC 240) is still placed on the logic die, but the switch used and metal connections (e.g., switch 299 and global NoC 297) can be placed into the interposer layer that can be cut as well along with scribe line.

It is appreciated that FIGS. 2A-2B illustrates an example tile including a plurality of interconnected components and is not intended to be limiting. A person of ordinary skill in the art will understand that an IC tile can include any number of components of any types that are organized and connected in any suitable arrangement to provide desired functions of an IC device. The IC architectures discussed herein can include single or multiple heterogeneous tiles that have various components including but not limited to AI accelerators, video codec, local NoC, peripheral/connection interfaces, etc. In some examples, each of the multiple tiles on wafer 100 may include similar components configured to perform the same functions. In some embodiments, the multiple tiles on wafer 100 may include different components and configured to perform different functions from each other. Further, the tiles can be connected through global NoCs which could be cut on the wafer without affecting the functionality of individual tiles or connections of other tiles.

As discussed in FIGS. 1A-1F and 2, the present disclosure provides a scalable architecture for preparing ICs (e.g., SoCs) for various IC devices and systems via 3D wafer-to-wafer bonding. In particular, even after a design layout on a wafer is finalized, various numbers and combinations of tiles can be selected for different IC devices and systems via flexible wafer dicing to provide different functions with desired computing power and storage capacity. The ICs designed and fabricated in the present disclosure can be used in a wide range of fields including, but not limited to AI, machine learning, video processing, general computing, etc.

For example, a cloud computing system may require a memory size of at least 256 MB, while edge computing may only need a memory size of 64 MB. Memory wafer 160 in FIG. 1C may include regular and repeating array memory cells (e.g., on 16 mm² tiles) and may satisfy different needs by cutting to different number of tiles. However, conventional computing blocks on the logic wafer are irregular, and requires redesign for different applications with different hardware requirements.

In the present disclosure, as illustrated in FIGS. 1A-1F and 2, by providing the scalable architecture including logic tiles in logic wafer 100 aligned with memory tiles in memory wafer 160, different IC chips with different dimensions or functions can be obtained from a single logic wafer or a 3D wafer-to-wafer stack via flexible wafer dicing. The design and fabrication of the logic wafer may be based on a single design file (e.g., a GDSII file). As such, the design and fabrication of the ICs can avoid multiple rounds of designing and wafer fabrication to save the NRE cost and reduce the time-to-market.

In some embodiments, the flexible dicing schemes provided in the present disclosure can also provide multiple IC chips originated from the same wafer or wafer stack but for different products, different market needs, or different device makers. For example, one type of IC made from wafer stack 150 includes a single IC block (e.g., logic tile 130 bonded with memory tile 162) that can be integrated into an electronic device to perform video codec related functions. In another example, another type of IC made from wafer stack 150 can include multiple IC blocks (e.g., logic tile 132 bonded with memory tiles 164, 166, 168, and 170) that can be integrated into an AI accelerator system. As such, the IC architectures disclosed herein can support multiple product wafer (MPW) methodology for 3D wafer-to-wafer hybrid bonding. Different device makers can share the wafer design and fabrication cost and reduce wasting of wafer. The architectures and processes disclosed herein can also use low-cost solutions, such as wafer-to-wafer hybrid bonding, for high bandwidth access between logic tiles and DRAM tiles with high throughput fabrication.

Figure 3A:
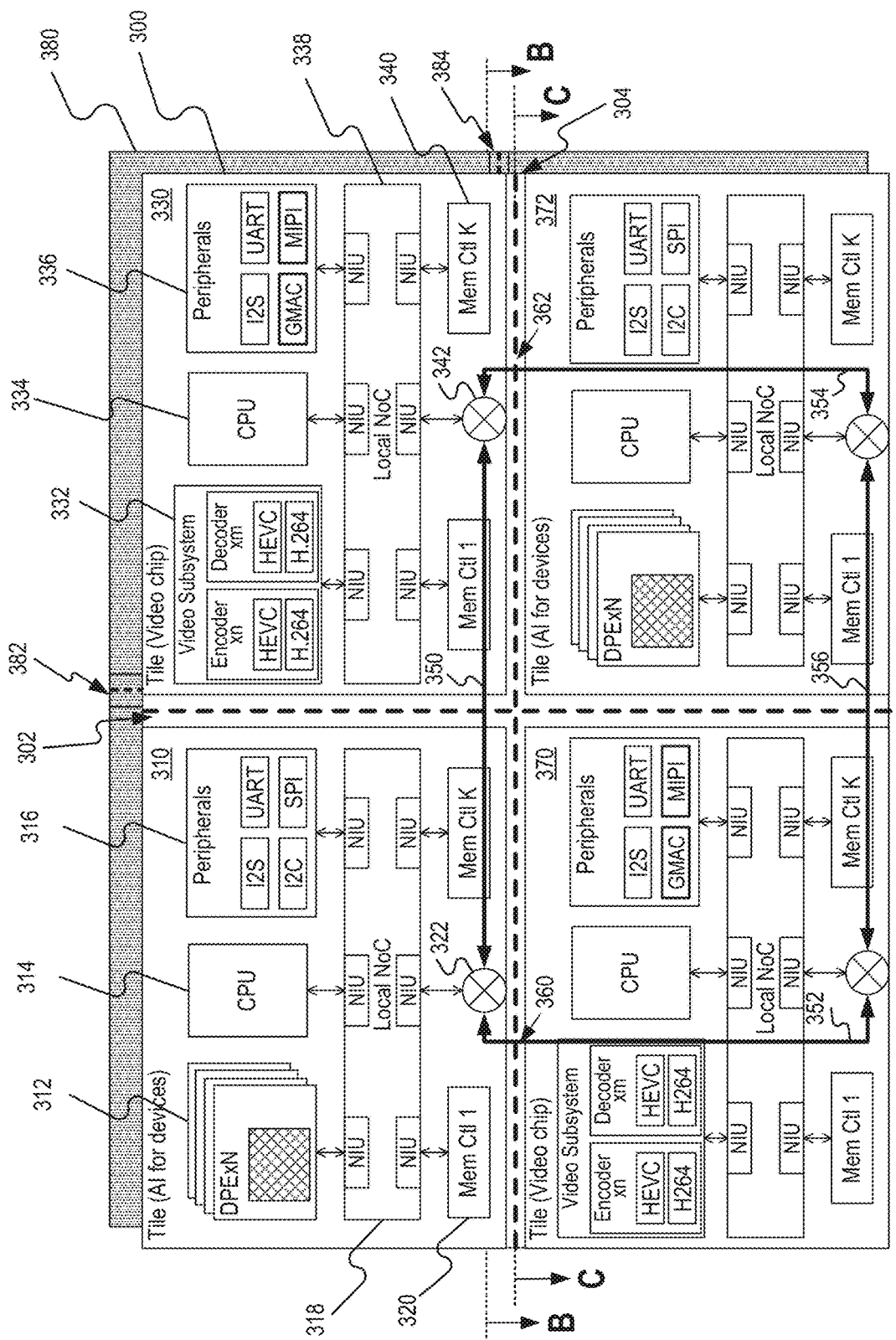
FIG. 3A is a block diagram illustrating an example scalable architecture for a system including a plurality logic tiles on a logic wafer to be bonded with a memory wafer, according to some embodiments of the present disclosure.

FIG. 3A is a block diagram illustrating an example scalable architecture for a system including multiple logic tiles on a logic wafer 300 to be bonded with a memory wafer 380, according to some embodiments of the present disclosure. It is appreciated that logic wafer 300 can be the same as logic wafer 100 as discussed in FIGS. 1A-1F and 2. In some embodiments as shown in FIG. 3A, logic wafer 300 includes four logic tiles 310, 330, 370, 372. It is appreciated that the logic tiles 310, 330, 370, and 372 can be the same as any logic tile on logic wafer 100 as discussed in FIGS. 1A-1F and 2A. For example, each logic tile in FIG. 3A may represent an implementation example of logic tile 222 in FIG. 2A. In some embodiments, a respective logic tile on logic wafer 300 may have a size of 16 mm², 32 mm², 64 mm², 128 mm², or any other suitable size. In some embodiments, the multiple logic tiles on logic wafer 300 have identical dimension to each other. In some embodiments, the four tiles interconnected by global NoC 360 as shown in FIG. 3A may be used for edge computing or video codec processing. In some embodiments, each of the four tiles in FIG. 3A can be implemented in a separate and independent SoC device.

In some embodiments as shown in FIG. 3A, logic wafer 300 includes an array of two by two logic tiles including alternating artificial intelligence (AI) logic tiles (e.g., logic tiles 310 and 372) and video logic tiles (e.g., logic tiles 330 and 370) that are communicatively interconnected by a plurality of global interconnects. In some embodiments, a respective AI logic tile (e.g., logic tile 310) includes a plurality of deep learning processing elements (DPEs) configured to support AI computing, a central processing unit (CPU), and one or more memory controllers interconnected by a first local network on chip (NoC). The one or more memory controllers of the AI logic tile may be connected to one or more memory tiles on the memory wafer. In some embodiments, a respective video logic tile (e.g., logic tile 330) includes one or more video processing units, a CPU, and one or more memory controllers interconnected by a second local NoC. The one or more memory controllers may be connected to one or more memory tiles on the memory wafer.

In some embodiments, logic tile 310 may be identical to logic tile 372, and include circuitry configured to perform AI related functions, such as AI training, machine learning, deep learning, neural network processing, graphic processing, etc. In some embodiments, logic tile 310 is also referred to as AI tile in the present disclosure. In some embodiments, logic tile 310 includes function unit 312, CPU 314, peripherals 316, and one or more memory controllers 320, that are interconnected via a local NoC 318.

In some embodiments, function unit 312 includes a deep learning unit (DPL) that includes one or more deep learning processing elements (DPEs) configured to support a deep learning engine used for AI computing in an IC device. In some embodiments, function unit 312 includes artificial intelligence ("AI") training processors, AI training chips, neural processing units ("NPU"), deep learning units (DPU), or graphic processing units ("GPU").

In some embodiments, CPU 314 may include circuitry configured to execute instructions to support various functions, e.g., computing algorithms, controlling signals, and I/O operations. In some embodiments, peripherals 316 include one or more chip interfaces such as I2C bus, I2S bus, SPI, and UART to support data or signal communication between tile 310 and devices connected to tile 310 using the chip interfaces. For example, peripherals 316 may support connections to debug device(s), storage memories, I/O devices that locate outside logic tile 310.

In some embodiments, one or more memory controllers 320 include circuitry configured to manage and control data transmitted between logic tile 310 and corresponding DRAM memories (e.g., memory tiles on memory wafer 380 that are integrated together with logic tile 310). For example, memory controllers 320 implement logic used to read, write, and refresh the corresponding DRAM memories. In some embodiments, local NoC 318 includes a high-speed on-chip interconnect that connects together the various components on tile 310 via respective network interface units (NIUs). For example, data, messages, interrupts, signals, or the like can be communicated among the components within tile 310 via local NoC 318 based on headers and payloads for routing the packets. As such, data communication can be optimized and reduced latency. It is appreciated that local NoC 318 can also be replaced by other kinds of buses.

In some embodiments, as shown in FIG. 3A, logic tile 330 may be identical to logic tile 370, and include circuitry configured to perform video codec related functions, such as video compression, decompression, or video transcoding, etc. In some embodiments, logic tile 330 is also referred to as video tile in the present disclosure. In some embodiments, logic tile 330 includes function unit 332, CPU 334, peripherals 336, and one or more memory controllers 340, that are interconnected via a local NoC 338.

In some embodiments, function unit 332 includes one or more encoders and decoders configured to perform various video processing. For example, an encoder or a decoder may be compatible with one or more video coding standards such as high efficiency video coding (HEVC) video, H.264 and MPEG-4. In some embodiments, CPU 334 may include circuitry configured to execute instructions to support various functions, e.g., computing algorithms, controlling signals, and I/O operations. In some embodiments, peripherals 336 include one or more chip interfaces such as I2S, UART, GMAC, and mobile industry processor interface (MIPI) to support media data or signal communication between tile 330 and external devices connected to tile 330 using the chip interfaces. For example, peripherals 336 may support connections to storage memories and I/O devices that locate outside logic tile 330.

In some embodiments, one or more memory controllers 340 include circuitry configured to manage and control data transmitted between logic tile 330 and corresponding DRAM memories (e.g., memory tiles on memory wafer 380 that are integrated together with logic tile 330). For example, memory controllers 340 implement logic used to read, write, and refresh the corresponding DRAM memories. In some embodiments, local NoC 338 includes a high-speed on-chip interconnect that connects together the various components on tile 330 via respective network interface units (NIUs). For example, data, messages, interrupts, signals, or the like can be communicated among the components within tile 330 via local NoC 338 based on headers and payloads for routing the packets. As such, data communication can be optimized and reduced latency. It is appreciated that local NoC 338 can also be replaced by other kinds of buses.

In some embodiments, wafer 300 further includes one or more switches (e.g., switch 322 and 342) connected to global NoCs (e.g., global NoCs 350 and 352) to provide channels for exchanging signals or data between tiles (e.g., tiles 310, 330, 370, and 372). In some embodiments, a switch is a multiplexer for routing data. For example, switch 322 is configured to route data packets from tile 310 to other tiles, such as tiles 330 or 370 via global NoC 350 and 352 respectively.

Figure 3B:
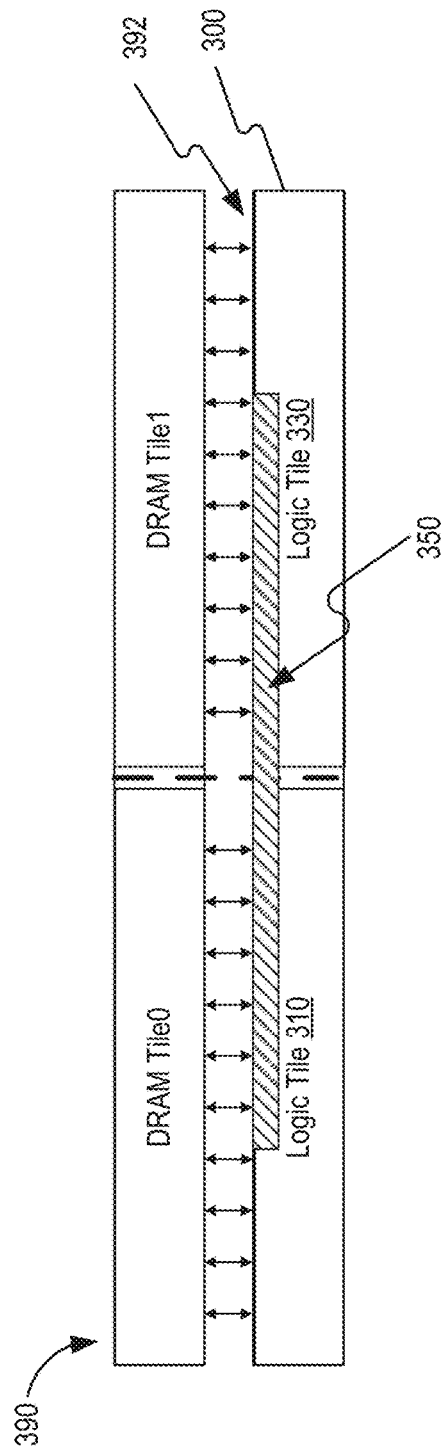
FIG. 3B is a block diagram illustrating a cross-section view of a global network-on-chip (NoC) obtained by cutting the bonded wafers in FIG. 3A along line B-B, according to some embodiments of the present disclosure.

In some embodiments as shown in FIG. 3A, memory wafer 380 (e.g., DRAM wafer) may be stacked and bonded with logic wafer 300 after fabricating ICs on logic wafer 300 (e.g., as illustrated in an example in FIG. 3B). Although logic wafer 300 is placed on top of memory wafer 380 for illustration in FIG. 3A, different wafer layouts may be formed during bonding (e.g., as shown in FIGS. 1C-1F). For example, a memory wafer (not shown in FIG. 3A) may be placed on top of logic wafer 300 after bonding as shown in FIG. 3B. Memory wafer 380 may be the same as memory wafer 160 as discussed in FIG. 1C. For example, memory wafer 380 may include a plurality of memory tiles. In some embodiments, scribe lines, e.g., scribe lines 382 and 384 of FIG. 3A, for separating memory tiles on memory wafer 380 may be aligned with scribe lines, e.g., scribe lines 302 and 304, for separating logic tiles on logic wafer 300.

FIG. 3B is a block diagram illustrating a cross-section view 390 of global NoC 350 obtained by cutting bonded wafers 300 and 380 along line B-B, according to some embodiments of the present disclosure. In some embodiments, arrows 392 represent bonding between DRAM tiles of memory wafer 380 and logic tiles 310 and 330 of logic wafer 300, such as metal bonding and TSVs, which can provide efficient memory access with large bandwidth.

As shown in FIG. 3B, in some embodiments, global NoCs 350 may be fabricated by depositing multiple metal layers and performing lithography to the deposited metal layers to obtain the desired circuitry. In some embodiments, circuitry of global NoCs 350 are formed in metal layers in the upper layers (e.g., closer to the surface of wafer), such as top level metal layers 8 or 9 of 9 metal layers on logic tiles 310 and 330. It is appreciated that global NoCs 350 can also be formed in another structure, such as in interposer layer 295 as shown in FIG. 2B.

Figure 3C:
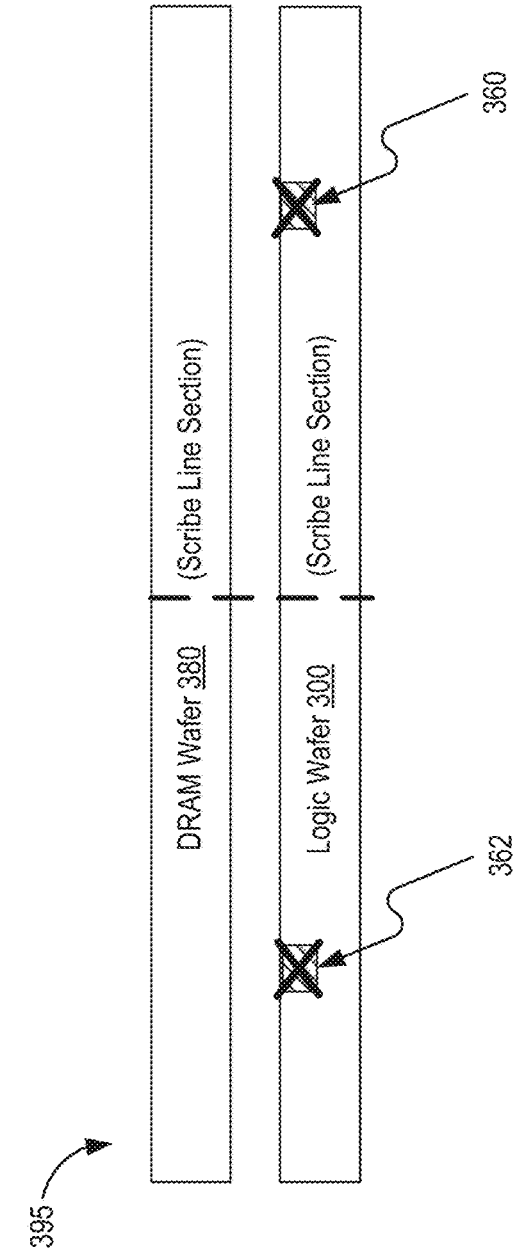
FIG. 3C is a block diagram illustrating a cross-section view obtained by cutting the bonded wafers in FIG. 3A along scribe line C-C, according to some embodiments of the present disclosure.

FIG. 3C is a block diagram illustrating a cross-section view 395 obtained by cutting the bonded wafers in FIG. 3A along scribe line C-C (e.g., scribe line 304), according to some embodiments of the present disclosure. In some embodiments, after cutting along scribe line 304 as shown in FIGS. 3A and 3C to separate tiles 310 and 330 from tiles 370 and 372, global NoCs 352 and 354 may be cut broken at locations 362 and 360 respectively without affecting the interconnection between tile 310 and 330 via global NoC 350. Further, the interconnection between multiple components within logic tile 310 via local NoC 318, or within logical tile 330 via local NoC 338 is also not affected by the cutting.

In some embodiments, the bonded wafers can be cut in any suitable manner in accordance with the device requirement. In some examples, by cutting either horizontally along scribe lines 304 and 384, or vertically along scribe lines 302 and 382, two logic tiles bonded with two memory tiles may be used in a system (e.g., a single SoC) to provide both AI features and video processing functions, such as by logic tile 310 and logic tile 330, or logic tile 310 and logic tile 370.

In some examples, by cutting both horizontally along scribe lines 304 and 384, and vertically along scribe lines 302 and 382, an individual logic tile bonded with an individual memory tile can be used in a system (e.g., a single SoC) to provide either AI features or video processing. For example, the device may require a lower level of computing power, such as for an edge device in deep neural network (DNN) computing, thus the device can use logic tile 310 bonded with the corresponding memory tile in memory wafer 380. In another example, the device may be used for video codec, such as encoding and decoding, the device can use logic tile 330 bonded with the corresponding memory tile in memory wafer 380.

In some examples, all four tiles as shown in FIG. 3A may be used in a computing system configured to perform video compression, decompression, and transcoding, as well as apply AI features associated with the video processing. Global NoCs as shown in FIG. 3A may be configured to connect all tiles on wafer 300 for communication. For example, the computing system may be used to optimize video compression. The computing system may include video processing unit (e.g., decoders in tiles 330 and 370) configured to decompress video data. The computing system may further include DNN processor (e.g., in tile 310 or 372)

configured to compute metadata associated with the decompression process performed by decoder (e.g., in tile 330 or 370). The results may be fed back to encoders (e.g., in tile 330 or 370) to increase compression ratio of the compression process. In some embodiments, for applications requiring various functions with different computing powers, the computing system may partition respective functions (e.g., DNN computing or video codec processing) to appropriate tiles. Global NoCs and switches may be used to provide efficient data routing and transmission among multiple tiles. In some embodiments, global NoCs working with switches on wafer 300 can route various types of data in different formats among different tiles for processing.

In some embodiments, when more than logic tile are included in a system, such as a larger or more complicated SoC, some peripherals may be disabled. One set of peripherals may remain active for one system. For example, when the system includes two, three, or four logic tiles, one set of peripherals on one logic tiles may remain active, peripherals on other logic tiles may be disabled.

As discussed herein, the system may include two levels of connections including a network of global NoCs and individual local NoCs for respective logic tiles. Global NoCs may provide inter-tile communication among different tiles, while local NoC may provide inner-tile communication among different components within a certain tile. The benefits of having two levels of connections include one level of connection may not affect the other level connection. For example, cutting off a global NoC to separate two tiles may not affect the connection of the local NoC within each tile. Local NoC can handle local connections and data communication, and further provide connection and data communication to associated global NoC. Further, cutting off a global NoC between two tiles may not affect other global NoCs providing connection to other tiles.

As discussed in the present disclosure, the modular design of tiles in a wafer can provide scalable architecture via flexible dicing. As such, one wafer design can apply to various IC devices or systems with different functions and sizes. There is no need for separate and customized design for each system. As such, the scalable architecture design can save cost and time, and reduce waste on the wafer.

Further, the alternating layout between AI tile and video tile in FIG. 3A is only provided as an example for illustration purpose, and not intended to be limiting. It is appreciated that the tiles providing different functions can be arranged in any suitable fashion. In addition, switches in FIG. 3A are only illustrated in an exemplary arrangement. It is appreciated that any number of switches can be placed in any topologies suitable for the system, including but not limited to mesh as shown in FIG. 3A, ring, cross bar, or any other topology. In some embodiments, switches and global NoCs can be determined by the application functions of the system, or the amount of data communicated within the system.

Figure 4:
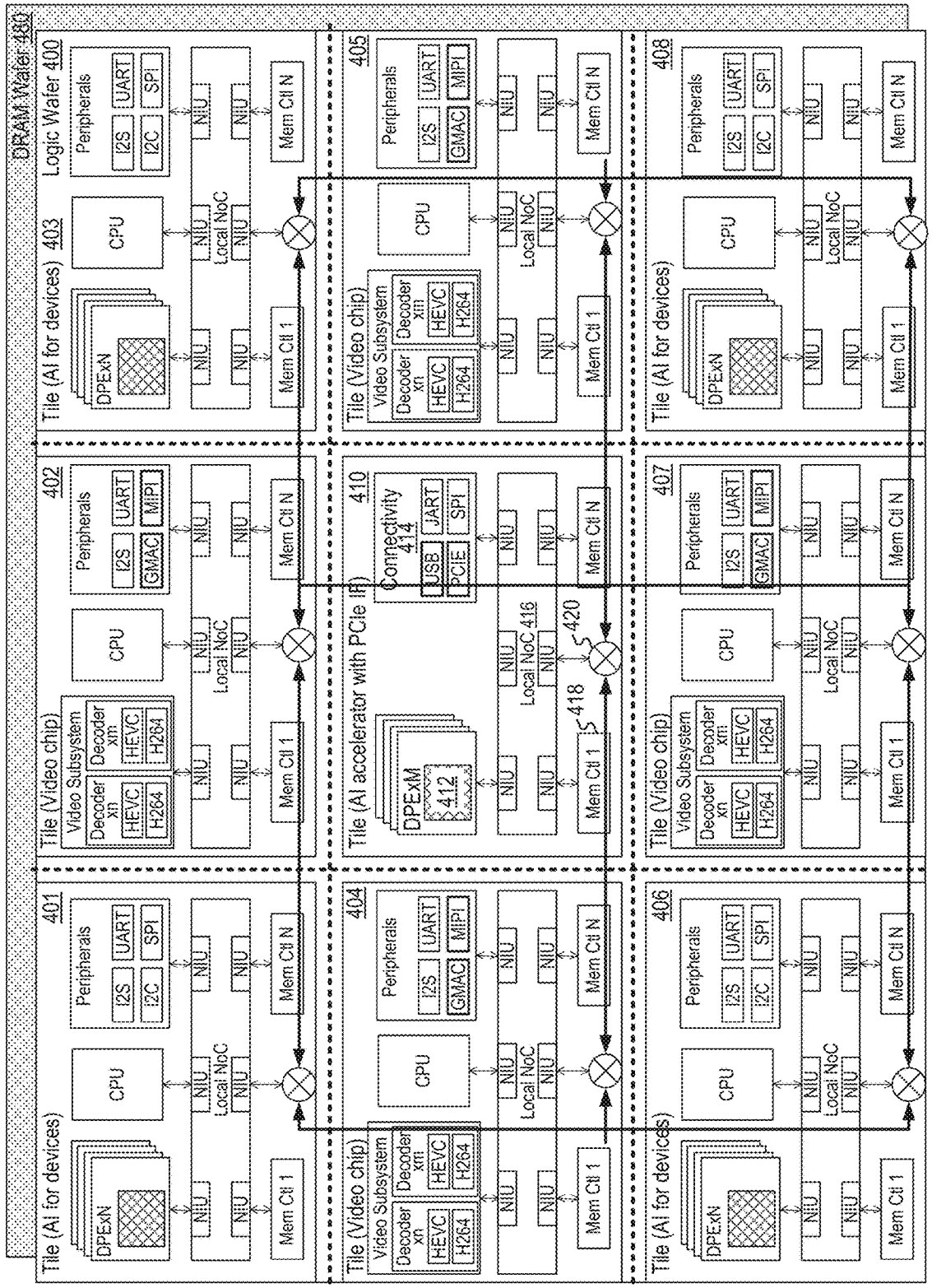
FIG. 4 is a block diagram illustrating an example scalable architecture for a system including a plurality logic tiles on a logic wafer to be bonded with a memory wafer, according to some embodiments of the present disclosure.

FIG. 4 is a block diagram illustrating an example scalable architecture for a system including a plurality of logic tiles on a logic wafer 400 to be bonded with a memory wafer 480, according to some embodiments of the present disclosure. It is appreciated that logic wafer 400 can be the same as logic wafer 100 as discussed in FIGS. 1A-1F and 2, or wafer 300 in FIGS. 3A-3C. In some embodiments as shown in FIG. 4, logic wafer 400 includes nine logic tiles 401, 402, 403, 404, 410, 405, 406, 407, and 408. In some embodiments, a respective logic tile on logic wafer 400 may have a size of 16 mm$^2$, 32 mm$^2$, 64 mm$^2$, 128 mm$^2$, or any other suitable size. In some embodiments, the multiple logic tiles on logic wafer 400 have identical dimension to each other.

In some embodiments as shown in FIG. 4, logic wafer 400 includes an array of three by three logic tiles including an artificial intelligence (AI) accelerator logic tile (e.g., logic tile 410) placed in the center of the array, and alternating AI logic tiles (e.g., tiles 401, 403, 406, and 408) and video logic tiles (e.g., tiles 402, 404, 405, and 407) surrounding the AI accelerator logic tile. The array of the three by three logic tiles may be communicatively interconnected by a plurality of global interconnects. In some embodiments, the AI accelerator logic tile includes a plurality of deep learning processing elements (DPEs), a central processing unit (CPU), and one or more memory controllers interconnected by a first local network on chip (NoC). The one or more memory controllers may be connected to one or more memory tiles on the memory wafer. The AI accelerator logic tile may include a connectivity unit (e.g., including a Peripheral Component Interconnect Express (PCIE) card) configured to be pluggable via a connection to a host system. For example, an IC including the AI accelerator logic tile can be plugged to the host system via the PCIE card for data communication with the host system. In some embodiments, a respective AI logic tile (e.g., substantially similar to AI tile 310) includes a plurality of DPEs, a CPU, and one or more memory controllers interconnected by a local (NoC). The one or more memory controllers may be connected to one or more memory tiles on the memory wafer. In some embodiments, a respective video logic tile (e.g., substantially similar to video tile 330) includes one or more video processing units, a CPU, and one or more memory controllers interconnected by a local NoC. The one or more memory controllers may be connected to one or more memory tiles on the memory wafer.

In some embodiments, logic wafer 400 includes AI tiles 401, 403, 406, and 408 that are substantially similar to AI tile 310 or 372 in FIG. 3A. In some embodiments, each of AI logic tiles 401, 403, 406, and 408 includes circuitry configured to perform AI related functions, such as machine learning, deep learning, etc. In some embodiments, each of AI logic tiles 401, 403, 406, and 408 includes components substantially similar to AI tile 310 as discussed in FIG. 3A.

In some embodiments, logic wafer 400 further includes video tiles 402, 404, 405, and 407 that are substantially similar to video tile 330 or 370 in FIG. 3A. In some embodiments, each of video tiles 402, 404, 405, and 407 includes circuitry configured to perform video codec related functions, such as video compression, decompression, or video transcoding, etc. In some embodiments, each of video tiles 402, 404, 405, and 407 includes components substantially similar to video tile 330 as discussed in FIG. 3A.

In some embodiments, logic wafer 400 also includes an AI accelerator tile 410. In some embodiments, AI accelerator tile 410 includes circuitry configured to perform server side functions, such as cloud computing, neural network (NN) computing accelerator, etc. In some embodiments, AI accelerator tile 410 includes a function unit 412, a connectivity unit 414, and one or more memory controllers 418, that are interconnected via a local NoC 416.

In some embodiments, function unit 412 includes one or more deep learning processing elements (DPEs) configured to support neural network engine used for AI accelerator. In some embodiments, connectivity unit 414 can be configured to communicate with a host system (e.g., server system) to receive one or more packets from the host system or an external source. For example, AI accelerator tile 400 can process not only packets from/to the host system, but also packets from/to the external source. In some embodiments, connectivity unit 414 can be based on a Universal Serial Bus (USB), a Serial Peripheral Interface (SPI), a JART, a parallel interface (e.g., Peripheral Component Interconnect (PCI)), a serial interface (e.g., Peripheral Component Interconnect Express (PCIE)), etc. In some embodiments, AI accelerator tile 410 includes a PCIE card that can be plugged in the host system and provide high speed transmission of data to the host system.

In some embodiments, one or more memory controllers 418 include circuitry configured to manage and control data transmitted between AI accelerator tile 410 and corresponding DRAM memories (e.g., memory tiles on memory wafer 480 that are integrated together with tile 410). For example, memory controllers 418 implement logic used to read, write, and refresh the corresponding DRAM memories. In some embodiments, local NoC 416 includes a high-speed on-chip interconnect that connects together the various components on tile 410 via respective network interface units (NIUs). For example, data, messages, interrupts, signals, or the like can be communicated among the components within tile 410 via local NoC 416 for routing the packets to optimize data communication and reduce latency.

In some embodiments, the nine tiles includes four AI accelerator tiles, four video tiles, and one AI accelerator tile. It is appreciated that AI accelerator tile 410 is placed in the middle of the nine tiles as an example for illustration as shown in FIG. 4. Under this configuration, AI accelerator tile 410 has relatively short communication distance to other eight tiles. This configuration can be beneficial if AI accelerator tile 410 is used with other eight tiles together in a system. It is appreciated that AI accelerator tile 410 is not limited to the middle location and can also be placed in any other configuration.

In some embodiments, wafer 400 further includes multiple switches connected to global NoCs to provide channels for exchanging signals or data between the tiles on wafer 400. In some embodiments, a switch is a multiplexer for routing data. In some embodiments, global NoCs can be in any suitable topology, such as mesh as shown in FIG. 4, ring, or other topology, to connect multiple tiles.

In some embodiments as shown in FIG. 4, memory wafer 480 (e.g., DRAM wafer) may be stacked and bonded with logic wafer 400 after fabricating ICs on logic wafer 400. Although logic wafer 400 is placed on top of memory wafer 480 for illustration in FIG. 4, different wafer layout may be formed during bonding. For example, memory 480 may be placed on top of logic wafer 400 after bonding (similar to the layout in FIG. 3B). Memory wafer 480 may be bonded with logic wafer 400 using any suitable bonding technologies, such as metal bonding, hybrid bonding, and TSVs. Memory wafer 480 may be the same as memory wafer 160 as discussed in FIG. 1C, or memory wafer 380 in FIG. 3A. For example, memory wafer 480 may include a plurality of memory tiles. Similar to discussion in FIGS. 2A-2B and 3A-3C, global NoCs in FIG. 4 may be cut broken to separate certain tiles without affecting the interconnection with other tiles, or the connection within respective tiles via the associated local NoC. As discussed herein, global NoCs or switches can be formed in another structure than logic wafer, such as an interposer layer 295 illustrated in FIG. 2B.

In some embodiments, scribe lines, e.g., scribe lines for separating memory tiles on memory wafer 480 may be aligned with scribe lines for separating logic tiles on logic wafer 400. In some embodiments, the bonded wafer structure as shown in FIG. 4 can be cut in any suitable manner in accordance with the device requirement. In some examples, two or three of the nine tiles, arranged either horizontal or vertical, can be included in a single SoC. In some examples, four (two by two) or six (two by three) of the nine tiles can be used in a single SoC. In some examples, all nine tiles as shown in FIG. 4 can be used in a single SoC, such as a server system for cloud computing.

In some embodiments, the nine tiles interconnected by global NoCs in combination with switches as shown in FIG. 4 may be used for various system, such as edge computing, video codec processing, AI accelerator, or combinations thereof. In some embodiments, any number from the nine tiles in FIG. 4, from one to nine, can be implemented in an independent SoC. For example, each of the nine tiles can be used in an individual SoC. In other examples, two (e.g., 1 by 2), three (e.g., 1 by 3), four (e.g., 2 by 2), six (e.g., 2 by 3), or nine (3 by 3) tiles can be cut from the nine tiles to use in a respective SoC.

In some embodiments, the number and function of logic tiles on wafer 400 can be selected depending on computing power needed for the system. For example, if the system is used on the server side and requires higher computing power, such as an AI accelerator server, more logic tiles, including AI accelerator tile 410 may be selected. In another example, if the system is used on the user side and requires lower computing power, such as a mobile device, fewer logic tiles with common AI tiles (e.g., AI tile 401) may be selected.

In some embodiments, the bandwidth provided by the global NoCs connected between AI accelerator tile with other tiles may be the same or may be different according to product requirements to support different traffic need. In some embodiments, bandwidth, placement of global NoCs, or locations of switches may be determined or customized by the application functions of the system, the bandwidth for data communication, or the data formats used by the system.

Figure 5:
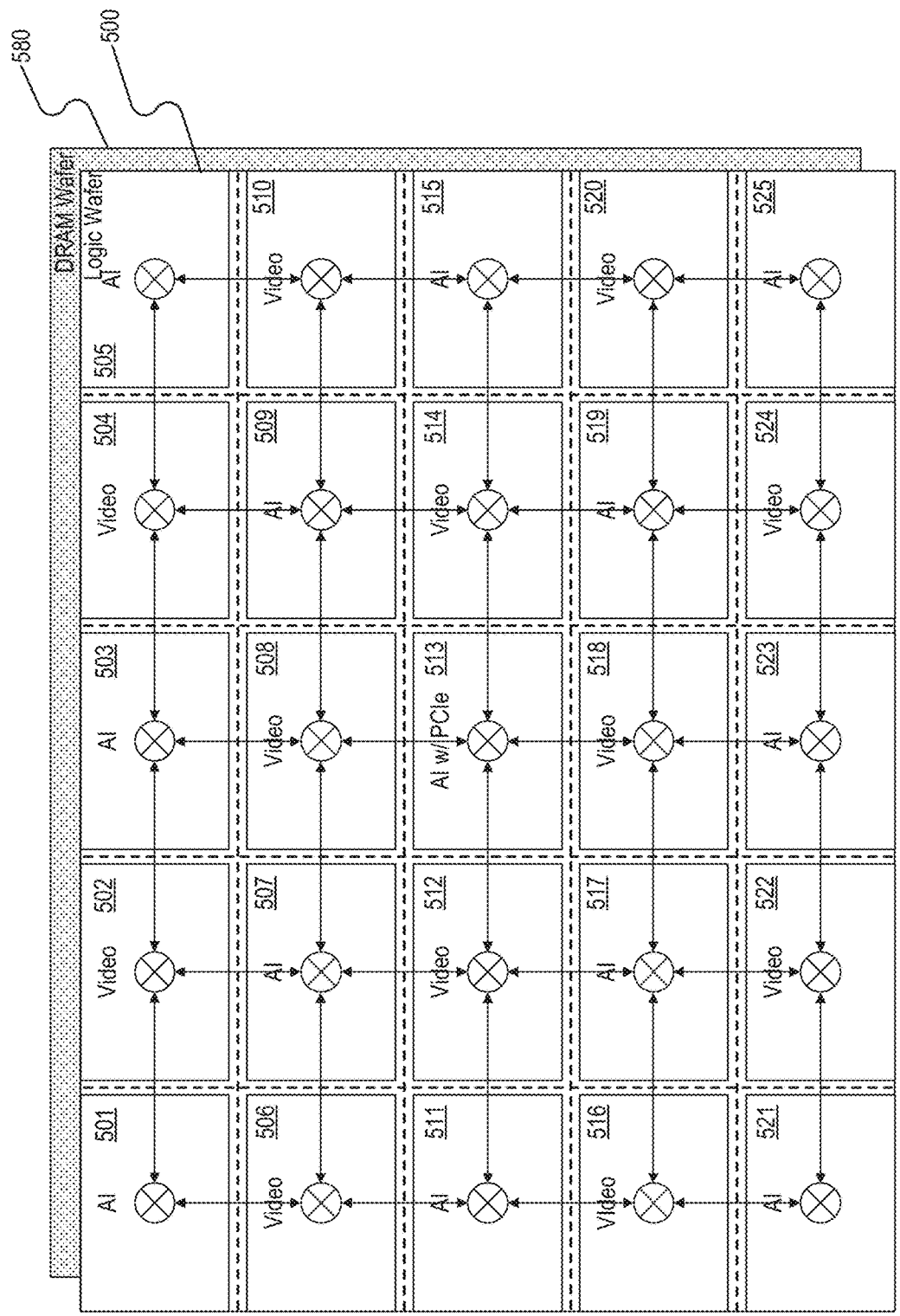
FIG. 5 is a block diagram illustrating an example scalable architecture for a system including a plurality logic tiles on a logic wafer to be bonded with a memory wafer, according to some embodiments of the present disclosure.
Figure 6B:
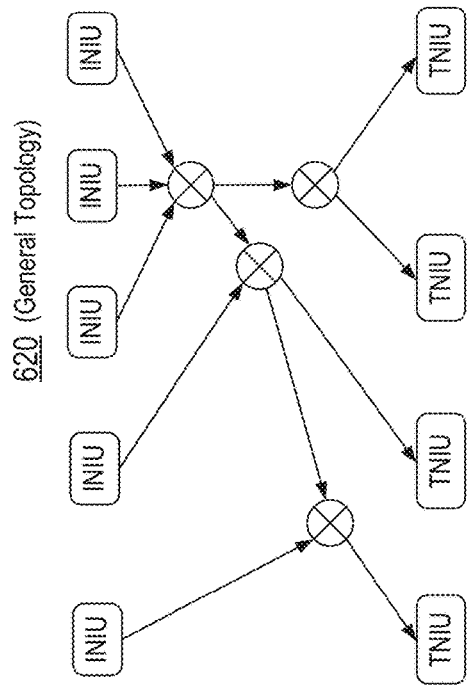
FIGS. 6A-6D are block diagrams illustrating various example layouts for global network-on-chip (NoC) coupled with switches that can be used in scalable architectures, according to some embodiments of the present disclosure.
Figure 6D:
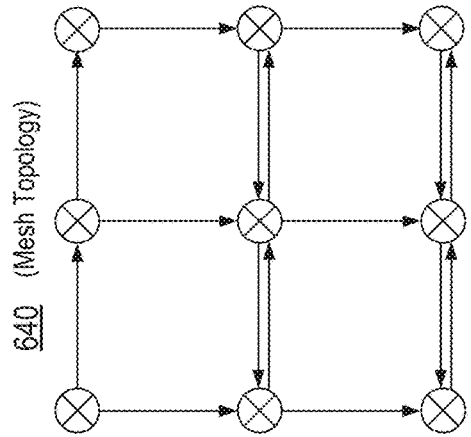
Figure 6A:
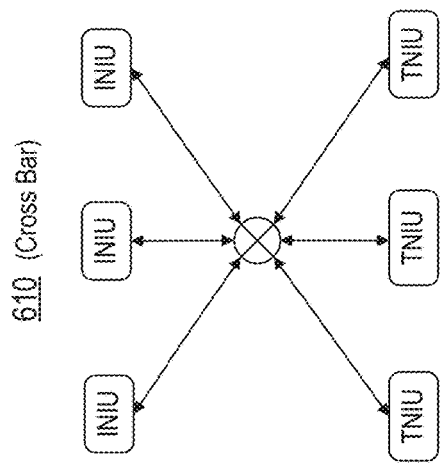
Figure 6C:
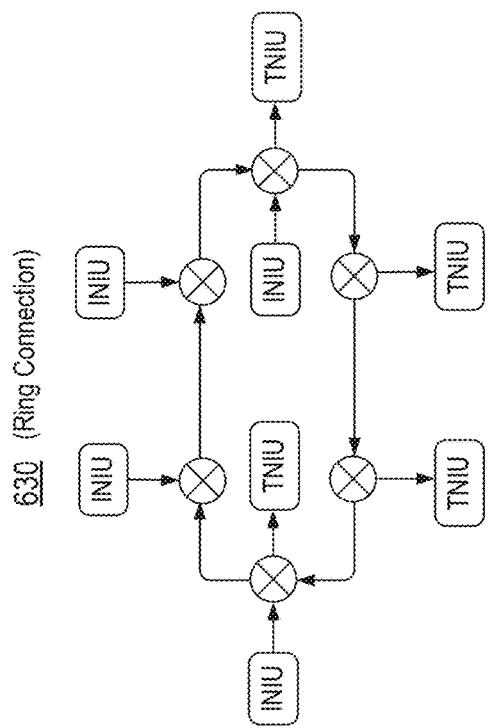

FIG. 5 is a block diagram illustrating an example architecture for a system including a plurality logic tiles on a logic wafer 500 bonded with a memory wafer 580, according to some embodiments of the present disclosure. It is appreciated that logic wafer 500 can be the same as logic wafer 100 as discussed in FIGS. 1A-1F and 2, wafer 300 in FIGS. 3A-3C, or wafer 400 in FIG. 4. In some embodiments, logic wafer 500 includes twenty five logic tiles 501-525 as shown in FIG. 5, in a 5 by 5 square. In some embodiments, a respective logic tile on logic wafer 500 may have a size of 16 mm$^2$, 32 mm$^2$, 64 mm$^2$, 128 mm$^2$, or any other suitable size. In some embodiments, the multiple logic tiles on logic wafer 500 have identical dimension to each other.

In some embodiments as shown in FIG. 5, logic wafer 500 includes an array of five by five logic tiles including an artificial intelligence (AI) accelerator logic tile (e.g., logic tile 513) placed in the center of the array, and alternating AI logic tiles (e.g., tiles 501, 503, 505, 515, 525, 523, 521, 511, 507, 509, 519, and 517) and video logic tiles (e.g., tiles 502, 504, 510, 520, 524, 522, 516, 506, 508, 514, 518, and 512) surrounding AI accelerator logic tile 513. The array of the five by five logic tiles may be communicatively interconnected by a plurality of global interconnects. In some embodiments, AI accelerator logic tile 513 is substantially similar to AI accelerator logic tile 410, and includes a plurality of deep learning processing elements (DPEs), a central processing unit (CPU), and one or more memory controllers interconnected by a first local network on chip (NoC). The one or more memory controllers may be connected to one or more memory tiles on the memory wafer. AI accelerator logic tile 513 may include a connectivity unit (e.g., including a Peripheral Component Interconnect Express (PCIE) card) configured to be pluggable via a connection to a host system. For example, an IC including AI accelerator logic tile 513 can be plugged to the host system via the PCIE card for data communication with the host system. In some embodiments, a respective AI logic tile (e.g., substantially similar to AI tile 310) includes a plurality of DPEs, a CPU, and one or more memory controllers interconnected by a local (NoC). The one or more memory controllers may be connected to one or more memory tiles on the memory wafer. In some embodiments, a respective video logic tile (e.g., substantially similar to video tile 330) includes one or more video processing units, a CPU, and one or more memory controllers interconnected by a local NoC. The one or more memory controllers may be connected to one or more memory tiles on the memory wafer.

In some embodiments, logic wafer 500 includes AI tiles 501, 503, 505, 507, 509, 511, 515, 517, 519, 521, 523, and 525 that are substantially similar to AI tile 310 or 372 in FIG. 3A, or AI tile 401, 403, 406, or 408 in FIG. 4. In some embodiments, each AI logic tile on wafer 500 includes circuitry configured to perform AI related functions, such as machine learning, deep learning, etc. In some embodiments, each AI logic tile on wafer 500 includes components substantially similar to AI tile 310 as discussed in FIG. 3A.

In some embodiments, logic wafer 500 further includes video tiles 502, 504, 506, 508, 510, 512, 514, 516, 518, 520, 522, and 524 that are substantially similar to video tile 330 or 370 in FIG. 3A, or video tile 402, 404, 405, or 407 in FIG. 4. In some embodiments, each video tile of wafer 500 includes circuitry configured to perform video codec related functions, such as video compression, decompression, or video transcoding, etc. In some embodiments, each video tile of wafer 500 includes components substantially similar to video tile 330 as discussed in FIG. 3A.

In some embodiments, logic wafer 500 also includes an AI accelerator tile 513. In some embodiments, AI accelerator tile 513 includes circuitry configured to perform server side functions, such as cloud computing, neural network (NN) computing accelerator, etc. In some embodiments, AI accelerator tile 513 is substantially similar to AI accelerator tile 410 as discussed in FIG. 4. For example, AI accelerator tile 513 also includes a function unit including DPEs, a connectivity unit including USB, PCIE, SPI, or JART interface configured to provide high speed data transmission, memory controllers for managing data transmission between AI accelerator tile 513 and corresponding DRAM memories, and local NoC providing high-speed on-chip interconnection among various components on tile 513.

In some embodiments as shown in FIG. 5, wafer 500 further includes multiple switches connected to global NoCs to provide channels for exchanging signals or data between the tiles on wafer 500. In some embodiments, a switch is a multiplexer for routing data. In some embodiments, global NoCs can be in any suitable topology, such as mesh as shown in FIG. 5, ring, or other topology, to connect multiple tiles.

In some embodiments as shown in FIG. 5, memory wafer 580 (e.g., DRAM wafer) may be stacked and bonded with logic wafer 500 after fabricating ICs on logic wafer 500. Although logic wafer 500 is placed on top of memory wafer 580 for illustration in FIG. 5, different wafer layout may be formed during bonding. For example, memory 580 may be placed on top of logic wafer 500 after bonding (similar to the layout in FIG. 3B). Memory wafer 580 may be bonded with logic wafer 500 using any suitable bonding technologies, such as metal bonding, hybrid bonding, and TSVs. Memory wafer 580 may be the same as memory wafer 160 as discussed in FIG. 1C, memory wafer 380 in FIG. 3A, or memory wafer 480 in FIG. 4. For example, memory wafer 580 may include a plurality of memory tiles. Similar to discussion in FIGS. 3A-3C, global NoCs in FIG. 5 may be cut broken to separate certain tiles without affecting the interconnection with other tiles, or the connection within respective tiles via the associated local NoC.

In some embodiments, scribe lines, e.g., scribe lines for separating memory tiles on memory wafer 580 may be aligned with scribe lines for separating logic tiles on logic wafer 500. In some embodiments, the bonded wafer structure as shown in FIG. 5 can be cut in any suitable manner in accordance with the device requirement. In some examples, any number of the twenty five tiles, from one to twenty five, arranged either horizontal or vertical, can be included in a single SoC.

In some embodiments as shown in FIG. 5, the twenty five tiles interconnected by global NoCs in combination with switches may be used for various system, such as edge computing, video codec processing, video transcoding, AI accelerator, cloud computing, or combinations thereof. In some embodiments, any number from the twenty five tiles in FIG. 5, from one to twenty five, can be implemented in an independent SoC system. For example, each of the twenty five tiles can be used in an individual SoC device. In other examples, two (e.g., 1 by 2), three (e.g., 1 by 3), four (e.g., 2 by 2, or 1 by 4), five (e.g., 1 by 5), six (e.g., 2 by 3), eight (e.g., 2 by 4), nine (e.g., 3 by 3), ten (e.g., 2 by 5), twelve (e.g., 3 by 4), fifteen (e.g., 3 by 5), sixteen (e.g., 4 by 4), twenty (e.g., 4 by 5), or twenty five (5 by 5) tiles can be cut from the twenty five tiles to use in a respective SoC system.

In some embodiments, the number and function of logic tiles on wafer 500 can be selected depending on computing power needed for the system. For example, if the system is used on the server side and requires higher computing power, such as an AI accelerator server, more logic tiles, including AI accelerator tile 513 may be selected. In another example, if the system is used on the user side and requires lower computing power, such as a mobile device, fewer logic tiles with common AI tiles (e.g., AI tile 501) may be selected.

It is appreciated that AI accelerator tile 513 is placed in the middle of the twenty five tiles as an example for illustration as shown in FIG. 5. Under this configuration, AI accelerator tile 513 has relatively short communication distance to other tiles. This configuration can be beneficial if AI accelerator tile 513 is used with other adjacent tiles together in a system. It is appreciated that AI accelerator tile 513 is not limited to the middle location and can also be placed in any other configuration.

In some embodiments, the bandwidth provided by various global NoCs connected between the tiles on wafer 500 may be the same or may be different according to product requirements to support different traffic need. In some embodiments, bandwidth, placement of global NoCs, or locations of switches may be determined or customized by the application functions of the system, the bandwidth for data communication, or the data formats used by the system.

FIGS. 6A-6D are block diagrams illustrating various example layouts for global network-on-chip (NoC) coupled with switches that can be used in scalable architectures, according to some embodiments of the present disclosure. It is appreciated that the various global NoC and switch layouts as shown in FIGS. 6A-6D, such as cross bar topology 610, general topology 620, right connection 630, or mesh topology 640, can be used in any scalable architectures as discussed in FIGS. 3A, 4, and 5 to provide high speed and efficient traffic routing for data transmission among tiles. In some embodiments, the global NoC can include multiple layered structures, e.g., different rows or columns of circuitry in the global NoC topology may be placed in different layers. For example, the first row of circuitry may be placed in a first layer, and a second row of circuitry may be placed in a second layer.

In some embodiments, a switch is a multiplexer for routing data based on the associated priority. The number, locations, or functions of the switches can be customized in accordance with the system requirements. In some embodiments, network interface units (NIUs) can transform packets from global NoC to local NoC according to local protocols. In some embodiments, initiator network interface units (INIUs) may function as masters to send requests to corresponding switch(es). A switch is configured to route traffic in accordance with the requested task to one or more target network interface units (TNIUs) that function as slaves to generate responses. In some embodiments, the switches will not be affected when certain part(s) of global NoC may be cut off during wafer dicing.

FIG. 7 illustrates a flowchart of an exemplary method for fabricating an integrated circuit (IC), such as a system-on-chip (SoC), based on scalable architectures, according to some embodiments of the present disclosure. It is appreciated that method 700 of FIG. 7 may be performed by a semiconductor fabrication equipment or assembly equipment. For example, one or more steps of method 700 may be performed at a semiconductor fabrication plant.

In step 705, a first wafer (e.g., wafer 300 in FIGS. 3A-3C) bonded with a second wafer (e.g., wafer 380 in FIGS. 3A-3C) are diced along at least one first scribe line and at least one second scribe line (e.g., scribe lines 304 and 384, or scribe lines 302 and 382) to obtain one or more integrated circuits (ICs), such as system-on-chips (SoCs). In some embodiments, the one or more ICs include an IC includes at least one tile (e.g., tile 130, FIG. 1C) from the first wafer bonded with at least one tile (e.g., tile 162, FIG. 1C) from the second wafer, as discussed in FIGS. 1C-1F, 3A, 4, and 5.

In block 710, a plurality of tiles (e.g., tiles 220, 222, 224, and 226 in FIG. 2A) are formed on the first wafer (e.g., wafer 100 in FIG. 2A). In some embodiments, the plurality of tiles are separated by at least one first scribe line (e.g., scribe lines 112 and 114 in FIG. 1B). In some embodiments, a respective tile (e.g., tile 222 in FIG. 2A) includes a function unit (e.g., function unit 230 in FIG. 2A) including circuitry configured to perform a certain function.

In block 720, the second wafer (e.g., wafer 380 in FIG. 3A) includes a plurality of tiles (e.g., including tile 162 of memory wafer 160, FIG. 1C) separated by at least one second scribe line (e.g., scribe lines 382, 384 in FIG. 3A). In some embodiments, the at least one second scribe line are substantially aligned with the at least one first scribe line, as discussed in FIGS. 1C and 3A-3C. In some embodiments, the first wafer (e.g., wafer 300 in FIG. 3A) can be bonded with the second wafer (e.g., wafer 380 in FIG. 3A).

In block 730, at least one global interconnect (e.g., global NoC 270 in FIG. 2A) is formed on the first wafer. In some embodiments, the at least one global interconnect can also be formed in another structure, such as an interposer layer 295 as described in FIG. 2B. In some embodiments, the at least one global interconnect is configured to communicatively connect the plurality of tiles of the first wafer. For example, as shown in FIG. 3A, tiles 310, 330, 370, and 372 on wafer 300 may be connected by global NoCs 350, 352, 354, and 356.

Figure 8:
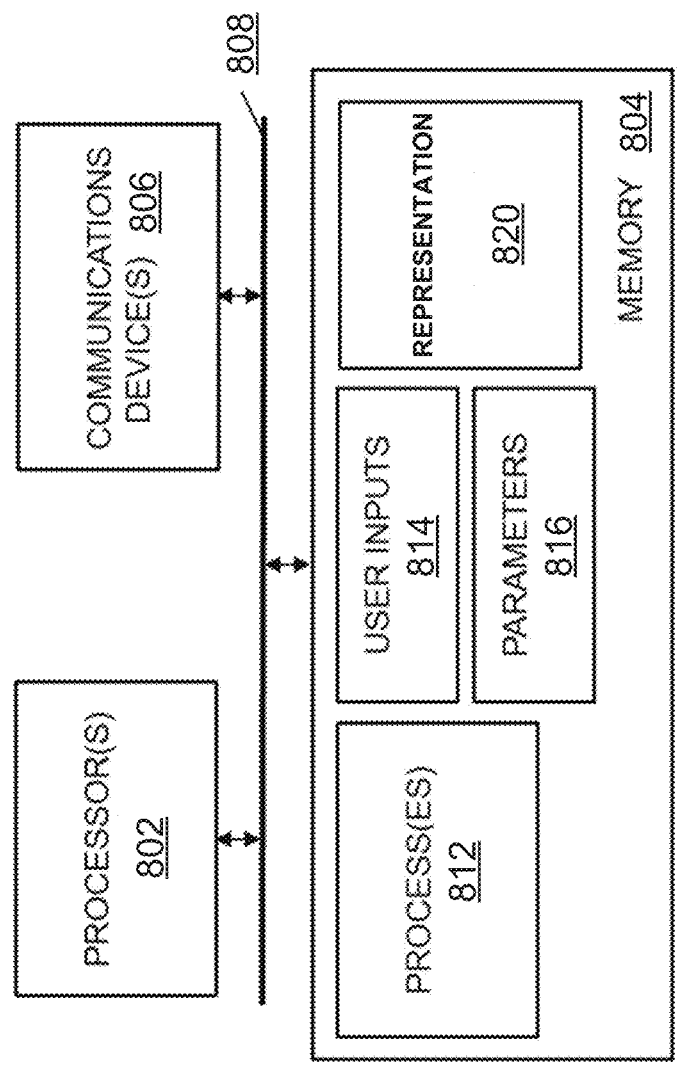
FIG. 8 is a block diagram illustrating an example processing system for processing or generating a representation of an integrated circuit (IC) system, according to some embodiments of the present disclosure.

FIG. 8 is a block diagram illustrating some embodiments of a processing system 800 for processing or generating a representation of an integrated circuit (IC) system (e.g., system in FIG. 1A-1F, 2A-2B, 3A-3C, 4, 5, or 6A-6D). Processing system 800 includes one or more processors 802, a memory 804, and one or more communications devices 806. Processors 802, memory 804, and communications devices 806 communicate using any suitable type, number, or configuration of wired or wireless connections 808.

Processors 802 execute instructions of one or more processes 812 stored in memory 804 to generate or process representation 820 responsive to user inputs 814 and parameters 816. Processes 812 may be any suitable type, number, or configuration of electronic design automation (EDA) tools or portions thereof used to design, simulate, analyze, or verify electronic circuitry or prepare electronic circuitry for manufacturing (e.g., by generating one or more representations 820 used to create one or more photomasks). In some embodiments, representation 820 includes data associated with any IC design layout that describes all or some portions of wafer 100 in FIGS. 1A-1F and 2A-2B, wafer 160 in FIG. 1C, wafer 300 or wafer 380 in FIGS. 3A-3C, wafer 400 or 480 in FIG. 4, wafer 500 or 580 in FIG. 5, and the IC components and structures on respective tiles as disclosed thereof. The data associated with representation 820 can be in any suitable format. Examples of such formats include a netlist, a hardware description language format, a field-programmable gate array bitstream, a library format, a simulation format, a graphic database system (GDS) or GDSII file, and a physical design (e.g., a layout or computer-aided design (CAD) file) format. In some embodiments, one or more processes 812, when executed by processors 802, may access a representation 820 of a first type, convert the representation 820 to a second type, and store the second type of representation in memory 804 or another suitable memory (not shown) via communications devices 806.

Memory 804 includes any suitable type, number, or configuration of non-transitory computer-readable storage media that store processes 812, user inputs 814, parameters 816, and representation 820. In some implementations, memory 804 may include high-speed random access memory, such as DRAM, SRAM, or other random access solid state memory devices. In some implementations, memory 804 includes non-volatile memory, such as one or more magnetic disk storage devices, optical disk storage devices, flash memory devices, or other non-volatile solid state storage devices. User inputs 814 may be received from any suitable source such as a keyboard, a mouse, or a touchscreen. Parameters 816 may include electronic circuit libraries, design policies, process rules, or other information used by one or more processes 812 to generate or process representation 820.

Communications devices 806 include any suitable type, number, or configuration of wired or wireless devices that transmit information from processing system 800 to another processing or storage system (not shown) or receive information from another processing or storage system (not shown). For example, communications devices 806 may transmit representation 820 to another system (not shown). Communications devices 806 may also receive processes 812, user inputs 814, parameters 816, or circuit component or element in representation 820 from another system (not shown) and cause processes 812, user inputs 814, parameters 816, or circuit component or element in representation 820 to be stored in memory 804.

It is appreciated that the above described embodiments can be implemented by hardware, or software (program codes), or a combination of hardware and software. If implemented by software, it may be stored in computer-readable media (e.g., stored in memory 804 in FIG. 8). The software, when executed by a processor (e.g., processor(s) 802), can facilitate creation and generation of design layouts (e.g., representation 820) associated with the scalable architectures as disclosed herein. Software instructions may also be used, when executed by one or more processors and working in conjunction with hardware, to implement method 700 in FIG. 7. The computing units and other functional units described in this disclosure can be implemented by hardware, or software, or a combination of hardware and software. It is understood that multiple ones of the above described modules/units may be combined as one module/unit, and each of the above described modules/units may be further divided into a plurality of sub-modules/sub-units.

The embodiments may further be described using the following clauses:

1. A system, comprising:
   a plurality of logic tiles formed on a logic wafer and that are separated by at least one first scribe line, a respective logic tile of the plurality of logic tiles including a function unit including circuitry configured to perform a respective function;
   at least one global interconnect configured to communicatively connect the plurality of logic tiles;
   a plurality of memory tiles formed on a memory wafer connected with the logic wafer, the plurality of memory tiles separated by at least one second scribe line on the memory wafer that is substantially aligned with the at least one first scribe line on the logic wafer, wherein the logic wafer and the memory wafer are simultaneously diced along the at least one first scribe line and the aligned at least one second scribe line to obtain a plurality of integrated circuits (ICs), a respective integrated circuit (IC) of the plurality of ICs including at least one logic tile connected with at least one memory tile.
2. The system of clause 1, wherein a first IC of the plurality of ICs includes a first number of logic tiles bonded with corresponding memory tiles, and a second IC of the plurality of ICs includes a second number of logic tiles bonded with corresponding memory tiles, the first number being different from the second number.
3. The system of any of clauses 1-2, wherein the plurality of ICs include a first IC including a first logic tile including first circuitry configured to perform a first function, and a second IC including a second logic tile including second circuitry configured to perform a second function different from the first function.
4. The system of any of clauses 1-3, wherein the respective IC includes a first logic tile and a second logic tile from the logic wafer connected with corresponding memory tiles from the memory wafer.
5. The system of any of clauses 1-4, wherein the function unit of the respective logic tile includes one or more neural network units.
6. The system of any of clauses claim 1-5, wherein the function unit of the respective logic tile includes a video decoder.
7. The system of any of clauses 1-6, wherein the respective logic tile further includes a central processing unit (CPU), one or more peripheral interfaces, and one or more one memory controllers interconnected with the function unit by a local interconnect.
8. The system of any of clauses 1-7, wherein the plurality of logic tiles on the logic wafer include a first logic tile including an artificial intelligence (AI) accelerator unit and a Peripheral Component Interconnect Express (PCIE) card, and wherein a first IC made from the first logic tile is pluggable to a host system via the PCIE card.
9. The system of any of clauses 1-8, wherein:
   the plurality of logic tiles on the logic wafer include an array of two by two logic tiles including alternating artificial intelligence (AI) logic tiles and video logic tiles that are communicatively interconnected by a plurality of global interconnects;
   a respective AI logic tile including a plurality of deep learning processing elements (DPEs) configured to support AI computing, a central processing unit (CPU), and one or more memory controllers interconnected by a first local network on chip (NoC), the one or more memory controllers connected to one or more memory tiles on the memory wafer; and
   a respective video logic tile including one or more video processing units, a CPU, and one or more memory controllers interconnected by a second local NoC, the one or more memory controllers connected to one or more memory tiles on the memory wafer.
10. The system of any of clauses 1-8, wherein:
    the plurality of logic tiles on the logic wafer include an array of three by three logic tiles including an artificial intelligence (AI) accelerator logic tile placed in the center of the array, and alternating AI logic tiles and video logic tiles surrounding the AI accelerator logic tile, the array of the three by three logic tiles communicatively interconnected by a plurality of global interconnects;
    the AI accelerator logic tile including a plurality of deep learning processing elements (DPEs), a central processing unit (CPU), and one or more memory controllers interconnected by a first local network on chip (NoC), the one or more memory controllers connected to one or more memory tiles on the memory wafer, the AI accelerator logic tile further including a connectivity unit configured to be pluggable via a connection to a host system;
    a respective AI logic tile including a plurality of DPEs, a CPU, and one or more memory controllers interconnected by a second local (NoC), the one or more memory controllers connected to one or more memory tiles on the memory wafer; and
    a respective video logic tile including one or more video processing units, a CPU, and one or more memory controllers interconnected by a third local NoC, the one or more memory controllers connected to one or more memory tiles on the memory wafer.
11. The system of any of clauses 1-8, wherein:
    the plurality of logic tiles on the logic wafer include an array of five by five logic tiles including an artificial intelligence (AI) accelerator logic tile placed in the center of the array, and alternating AI logic tiles and video logic tiles surrounding the AI accelerator logic tile, the array of the five by five logic tiles communicatively interconnected by a plurality of global interconnects;
    the AI accelerator logic tile including a plurality of deep learning processing elements (DPEs), a central processing unit (CPU), and one or more memory controllers interconnected by a first local network on chip (NoC), the one or more memory controllers connected to one or more memory tiles on the memory wafer, the AI accelerator logic tile further including a Peripheral Component Interconnect Express (PCIE) card configured to be pluggable via a connection to a host system;
a respective AI logic tile including a plurality of DPEs, a CPU, and one or more memory controllers interconnected by a second local (NoC), the one or more memory controllers connected to one or more memory tiles on the memory wafer; and
a respective video logic tile including one or more video processing units, a CPU, and one or more memory controllers interconnected by a third local NoC, the one or more memory controllers connected to one or more memory tiles on the memory wafer.

12. The system of any of clauses 1-11, further comprising at least one switch connected with the at least one global interconnect for routing data among one or more logic tiles in the respective IC.

13. The system of any of clauses 1-12, wherein the plurality of ICs are used in different devices by different device makers.

14. The system of any of clauses 1-13, wherein the plurality of ICs include one or more system-on-chips (SoCs).

15. The system of any of clauses 1-14, wherein the at least one global interconnect is part of a plurality of global interconnects that are formed on the logic wafer in a topology selected from a ring connection, a cross bar topology, and a mesh topology.

16. A system, comprising:
a logic wafer including a first logic tile and a second logic tile that are separated by at least one first scribe line, the first logic tile including circuitry configured to perform a first function, the second logic tile including circuitry configured perform a second function different from the first function;
at least one global interconnect configured to communicatively couple the first logic tile with the second logic tile; and
a memory wafer bonded with the logic wafer, the memory wafer including a plurality of memory tiles separated by at least one second scribe line, the at least one second scribe line substantially aligned with the at least one first scribe line such that the logic wafer bonded with the memory wafer can be diced along the at least one first scribe line and the at least one second scribe line to obtain at least one integrated circuit (IC) including at least one logic tile connected with at least one memory tile.

17. The system of clause 16, further comprising:
a first set of logic tiles and a second set of logic tiles formed on the logic wafer, wherein the first logic tile is a part of the first set of logic tiles, the second logic tile is part of the second set of logic tiles, and wherein the at least one global interconnect is part of a plurality of global interconnects that are configured to communicatively couple the first set of logic tiles with the second set of logic tiles.

18. The system of any of clauses 16-17, wherein the at least one IC includes the first logic tile and the second logic tile from the logic wafer connected with corresponding memory tiles from the memory wafer.

19. The system of any of clauses 16-18, wherein the first logic tile has a substantially similar dimension as the second logic tile on the logic wafer.

20. The system of any of clauses 16-19, wherein the circuitry of the first logic tile comprises a first function unit including one or more neural network units, and the circuitry of the second logic tile comprises a second function unit including a video decoder.

21. The system of any of clauses 16-20, wherein:
the logic wafer includes an array of two by two logic tiles including alternating artificial intelligence (AI) logic tiles and video logic tiles that are communicatively interconnected by a plurality of global interconnects;
a respective AI logic tile including a plurality of deep learning processing elements (DPEs) configured to support AI computing, a central processing unit (CPU), and one or more memory controllers interconnected by a first local network on chip (NoC), the one or more memory controllers connected to one or more memory tiles on the memory wafer; and
a respective video logic tile including one or more video processing units, a CPU, and one or more memory controllers interconnected by a second local NoC, the one or more memory controllers connected to one or more memory tiles on the memory wafer.

22. The system of any of clauses 16-20, wherein:
the logic wafer includes an array of three by three logic tiles including an artificial intelligence (AI) accelerator logic tile placed in the center of the array, and alternating AI logic tiles and video logic tiles surrounding the AI accelerator logic tile, the array of the three by three logic tiles communicatively interconnected by a plurality of global interconnects;
the AI accelerator logic tile including a plurality of deep learning processing elements (DPEs), a central processing unit (CPU), and one or more memory controllers interconnected by a first local network on chip (NoC), the one or more memory controllers connected to one or more memory tiles on the memory wafer, the AI accelerator logic tile further including a connectivity unit configured to be pluggable via a connection to a host system;
a respective AI logic tile including a plurality of DPEs, a CPU, and one or more memory controllers interconnected by a second local (NoC), the one or more memory controllers connected to one or more memory tiles on the memory wafer; and
a respective video logic tile including one or more video processing units, a CPU, and one or more memory controllers interconnected by a third local NoC, the one or more memory controllers connected to one or more memory tiles on the memory wafer.

23. The system of any of clauses 16-20, wherein:
logic wafer includes an array of five by five logic tiles including an artificial intelligence (AI) accelerator logic tile placed in the center of the array, and alternating AI logic tiles and video logic tiles surrounding the AI accelerator logic tile, the array of the five by five logic tiles communicatively interconnected by a plurality of global interconnects;
the AI accelerator logic tile including a plurality of deep learning processing elements (DPEs), a central processing unit (CPU), and one or more memory controllers interconnected by a first local network on chip (NoC), the one or more memory controllers connected to one or more memory tiles on the memory wafer, the AI accelerator logic tile further including a Peripheral Component Interconnect Express (PCIE) card configured to be pluggable via a connection to a host system;
a respective AI logic tile including a plurality of DPEs, a CPU, and one or more memory controllers interconnected by a second local (NoC), the one or more memory controllers connected to one or more memory tiles on the memory wafer; and
a respective video logic tile including one or more video processing units, a CPU, and one or more memory controllers interconnected by a third local NoC, the one or more memory controllers connected to one or more memory tiles on the memory wafer.

24. The system of any of clauses 16-23, wherein the at least one IC includes multiple ICs having different number of logic tiles that are determined during dicing.

25. The system of any of clauses 16-24, wherein the at least one IC includes multiple ICs that are used in different devices by different device makers.

26. The system of any of clauses 16-25, wherein the at least one IC includes at least one system-on-chip (SoC).

27. The system of any of clauses 16-26, wherein the at least one global interconnect is part of a plurality of global interconnects that are formed on the logic wafer in a topology selected from a ring connection, a cross bar topology, and a mesh topology.

28. A method for fabricating one or more integrated circuits (ICs), the method comprising:
dicing a logic wafer bonded with a memory wafer along at least one first scribe line and at least one second scribe line to obtain the one or more ICs, the one or more ICs including a first integrated circuit (IC) that includes at least one logic tile of a plurality of logic tiles from the logic wafer connected with at least one memory tile of a plurality of memory tiles from the memory wafer, wherein:
the plurality of logic tiles on the logic wafer are separated by the at least one first scribe line, a respective logic tile of the plurality of logic tiles on the logic wafer including a function unit including circuitry configured to perform a function;
the plurality of memory tiles on the memory wafer are separated by at least one second scribe line that is substantially aligned with the at least one first scribe line on the logic wafer; and
at least one global interconnect is configured to communicatively connect the plurality of logic tiles on the logic wafer.

29. The method of any of clause 28, wherein the first IC of the one or more ICs including a first number of logic tiles bonded with corresponding memory tiles, and a second IC of the one or more ICs includes a second number of logic tiles bonded with corresponding memory tiles, the first number being different from the second number.

30. The method of any of clauses 28-29, wherein the plurality of logic tiles include a first set of logic tiles and a second set of logic tiles, a first logic tile from the first set of logic tiles including circuitry configured to perform a first function, and a second logic tile from the second set of logic tiles including circuitry configured to perform a second function different from the first function.

31. The method of any of clauses 28-30, wherein the first IC includes at least the first logic tile and at least the second logic tile from the logic wafer bonded with corresponding memory tiles from the memory wafer.

32. The method of any of clauses 28-31, wherein the logic wafer further comprises at least one switch configured to connect with the at least one global interconnect for routing data among one or more logic tiles in the first IC.

33. The method of any of clauses 28-32, wherein the one or more ICs include multiple ICs that are used in different devices by different device makers.

34. The method of any of clauses 28-33, wherein the one or more ICs include one or more system-on-chips (SoCs).

35. The method of any of clauses 28-34, wherein the at least one global interconnect is part of a plurality of global interconnects that are formed on the logic wafer in a topology selected from a ring connection, a cross bar topology, and a mesh topology.

36. A computer-readable medium storing a representation of an integrated circuit (IC) system, the IC system comprising:
a plurality of logic tiles formed on a logic wafer and that are separated by at least one first scribe line, a respective logic tile of the plurality of logic tiles including a function unit including circuitry configured to perform a respective function;
at least one global interconnect configured to communicatively connect the plurality of logic tiles;
a plurality of memory tiles formed on a memory wafer connected with the logic wafer, the plurality of memory tiles separated by at least one second scribe line on the memory wafer that is substantially aligned with the at least one first scribe line on the logic wafer,
wherein the logic wafer and the memory wafer are simultaneously diced along the at least one first scribe line and the aligned at least one second scribe line to obtain a plurality of integrated circuits (ICs), a respective IC of the plurality of ICs including at least one logic tile connected with at least one memory tile.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

It is appreciated that the embodiments disclosed herein can be used in various application environments, such as artificial intelligence (AI) training and inference, database and big data analytic acceleration, video compression and decompression, and the like. AI-related applications can involve neural network-based machine learning (ML) or deep learning (DL). Therefore, the embodiments of the present disclosure can be used in various neural network architectures, such as deep neural networks (DNNs), convolutional neural networks (CNNs), recurrent neural networks (RNNs), video codec, video transcoding, or the like. For example, some embodiments of present disclosure can be used in AI inference of DNN. Embodiments of the architectures of the present disclosure can be applied to many systems. For example, some embodiments of the present disclosure can be applied to Ali-NPU (e.g., Hanguang NPU), Ali-Cloud, Ali PIM-AI (Processor-in Memory for AI), Ali-DPU (Database Acceleration Unit), Ali-AI platform, Ali-Data Center AI Inference Chip, IoT Edge AI Chip, GPU, TPU, or the like.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method. In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

What is claimed is:

1. A system, comprising:
   a plurality of first tiles formed on a first wafer and that are separated by at least one first scribe line;
   a plurality of second tiles formed on a second wafer connected with the first wafer, the plurality of second tiles separated by at least one second scribe line on the second wafer, wherein the second scribe line is substantially aligned with the at least one first scribe line on the first wafer, wherein the first wafer and the second wafer are simultaneously diced along the at least one first scribe line and the substantially aligned at least one second scribe line to obtain a plurality of integrated circuits (ICs), a respective integrated circuit (IC) of the plurality of ICs including at least one first tile connected with at least one second tile;
   at least one global interconnect configured to communicatively connect the plurality of first tiles; and
   at least one switch connected with the at least one global interconnect for routing data among one or more first tiles in the respective IC.

2. The system of claim 1, wherein the plurality of first tiles comprise at least one logic tile formed on a logic wafer, the at least one logic tile including a function unit including circuitry configured to perform a function.

3. The system of claim 1, wherein the plurality of second tiles comprise at least one memory tile formed on a memory wafer.

4. The system of claim 1, wherein a first IC of the plurality of ICs includes a first number of first tiles bonded with corresponding second tiles, and a second IC of the plurality of ICs includes a second number of first tiles bonded with corresponding second tiles, the first number being different from the second number.

5. The system of claim 1, wherein the plurality of ICs include a first IC including at least one first tile including first circuitry configured to perform a first function, and a second IC including at least one second tile including second circuitry configured to perform a second function different from the first function.

6. The system of claim 1, wherein the plurality of first tiles on the first wafer comprise:
   an array of two by two logic tiles including alternating artificial intelligence (AI) logic tiles and video logic tiles that are communicatively interconnected by a plurality of global interconnects;
   a respective AI logic tile including a plurality of deep learning processing elements (DPEs) configured to support AI computing, a central processing unit (CPU), and one or more memory controllers interconnected by a first local network on chip (NoC), the one or more memory controllers connected to one or more memory tiles on the second wafer; and
   a respective video logic tile including one or more video processing units, a CPU, and one or more memory controllers interconnected by a second local NoC, the one or more memory controllers connected to one or more memory tiles on the second wafer.

7. The system of claim 1, wherein the plurality of first tiles on the first wafer comprise:
   an array of three by three logic tiles including an artificial intelligence (AI) accelerator logic tile placed in the center of the array, and alternating AI logic tiles and video logic tiles surrounding the AI accelerator logic tile, the array of the three by three logic tiles communicatively interconnected by a plurality of global interconnects;
   the AI accelerator logic tile including a plurality of deep learning processing elements (DPEs), a central processing unit (CPU), and one or more memory controllers interconnected by a first local network on chip (NoC), the one or more memory controllers connected to one or more memory tiles on the second wafer, the AI accelerator logic tile further including a connectivity unit configured to be pluggable via a connection to a host system;
   a respective AI logic tile including a plurality of DPEs, a CPU, and one or more memory controllers interconnected by a second local NoC, the one or more memory controllers connected to one or more memory tiles on the second wafer; and
   a respective video logic tile including one or more video processing units, a CPU, and one or more memory controllers interconnected by a third local NoC, the one or more memory controllers connected to one or more memory tiles on the second wafer.

8. The system of claim 1, wherein the plurality of first tiles on the first wafer comprise:
   an array of five by five logic tiles including an artificial intelligence (AI) accelerator logic tile placed in the center of the array, and alternating AI logic tiles and video logic tiles surrounding the AI accelerator logic tile, the array of the five by five logic tiles communicatively interconnected by a plurality of global interconnects;
   the AI accelerator logic tile including a plurality of deep learning processing elements (DPEs), a central processing unit (CPU), and one or more memory controllers interconnected by a first local network on chip (NoC), the one or more memory controllers connected to one or more memory tiles on the second wafer, the AI accelerator logic tile further including a Peripheral Component Interconnect Express (PCIE) card configured to be pluggable via a connection to a host system;
   a respective AI logic tile including a plurality of DPEs, a CPU, and one or more memory controllers interconnected by a second local NoC, the one or more memory controllers connected to one or more memory tiles on the second wafer; and
   a respective video logic tile including one or more video processing units, a CPU, and one or more memory controllers interconnected by a third local NoC, the one or more memory controllers connected to one or more memory tiles on the second wafer.

9. A method for fabricating one or more integrated circuits (ICs), the method comprising:
   dicing a first wafer bonded with a second wafer along at least one first scribe line and at least one second scribe line to obtain the one or more ICs, the one or more ICs including a first integrated circuit (IC) that includes at least one first tile of a plurality of first tiles from the first wafer connected with at least one second tile of a plurality of second tiles from the second wafer, wherein:
the plurality of first tiles on the first wafer are separated by the at least one first scribe line; and
the plurality of second tiles on the second wafer are separated by at least one second scribe line that is substantially aligned with the at least one first scribe line on the first wafer;
at least one global interconnect is configured to communicatively connect the plurality of first tiles; and
at least one switch is connected with the at least one global interconnect for routing data among one or more first tiles in the respective IC.

10. The method of claim 9, wherein the first IC of the one or more ICs including a first number of first tiles bonded with corresponding second tiles, and a second IC of the one or more ICs includes a second number of first tiles bonded with corresponding second tiles, the first number being different from the second number.

11. The method of claim 9, wherein the plurality of first tiles comprise at least one logic tile formed on a logic wafer, the at least one logic tile including a function unit including circuitry configured to perform a function.

12. The method of claim 11, wherein the plurality of first tiles include a first set of logic tiles and a second set of logic tiles, a first logic tile from the first set of logic tiles including circuitry configured to perform a first function, and a second logic tile from the second set of logic tiles including circuitry configured to perform a second function different from the first function.

13. The method of claim 11, wherein the plurality of second tiles comprise at least one memory tile formed on a memory wafer.

14. The method of claim 13, wherein the first IC includes at least a first logic tile and at least a second logic tile from the logic wafer bonded with corresponding memory tiles from the memory wafer.

15. A computer-readable medium storing a representation of an integrated circuit (IC) system, the IC system comprising:
a plurality of first tiles formed on a first wafer and that are separated by at least one first scribe line;
a plurality of second tiles formed on a second wafer connected with the first wafer, the plurality of second tiles separated by at least one second scribe line on the second wafer, wherein the second scribe line is substantially aligned with the at least one first scribe line on the first wafer,
wherein the first wafer and the second wafer are simultaneously diced along the at least one first scribe line and the substantially aligned at least one second scribe line to obtain a plurality of integrated circuits (ICs), a respective integrated circuit (IC) of the plurality of ICs including at least one first tile connected with at least one second tile;
at least one global interconnect configured to communicatively connect the plurality of first tiles; and
at least one switch connected with the at least one global interconnect for routing data among one or more first tiles in the respective IC.

16. The computer-readable medium of claim 15, wherein the plurality of first tiles comprise at least one logic tile formed on a logic wafer, the at least one logic tile including a function unit including circuitry configured to perform a function, and wherein the plurality of second tiles comprise at least one memory tile formed on a memory wafer.

17. The computer-readable medium of claim 15, wherein the plurality of first tiles on the first wafer comprise:
an array of two by two logic tiles including alternating artificial intelligence (AI) logic tiles and video logic tiles that are communicatively interconnected by a plurality of global interconnects;
a respective AI logic tile including a plurality of deep learning processing elements (DPEs) configured to support AI computing, a central processing unit (CPU), and one or more memory controllers interconnected by a first local network on chip (NoC), the one or more memory controllers connected to one or more memory tiles on the second wafer; and
a respective video logic tile including one or more video processing units, a CPU, and one or more memory controllers interconnected by a second local NoC, the one or more memory controllers connected to one or more memory tiles on the second wafer.

18. The computer-readable medium of claim 15, wherein the plurality of first tiles on the first wafer comprise:
an array of three by three logic tiles including an artificial intelligence (AI) accelerator logic tile placed in the center of the array, and alternating AI logic tiles and video logic tiles surrounding the AI accelerator logic tile, the array of the three by three logic tiles communicatively interconnected by a plurality of global interconnects;
the AI accelerator logic tile including a plurality of deep learning processing elements (DPEs), a central processing unit (CPU), and one or more memory controllers interconnected by a first local network on chip (NoC), the one or more memory controllers connected to one or more memory tiles on the second wafer, the AI accelerator logic tile further including a connectivity unit configured to be pluggable via a connection to a host system;
a respective AI logic tile including a plurality of DPEs, a CPU, and one or more memory controllers interconnected by a second local NoC, the one or more memory controllers connected to one or more memory tiles on the second wafer; and
a respective video logic tile including one or more video processing units, a CPU, and one or more memory controllers interconnected by a third local NoC, the one or more memory controllers connected to one or more memory tiles on the second wafer.

19. The computer-readable medium of claim 15, wherein the plurality of first tiles on the first wafer comprise:
an array of five by five logic tiles including an artificial intelligence (AI) accelerator logic tile placed in the center of the array, and alternating AI logic tiles and video logic tiles surrounding the AI accelerator logic tile, the array of the five by five logic tiles communicatively interconnected by a plurality of global interconnects;
the AI accelerator logic tile including a plurality of deep learning processing elements (DPEs), a central processing unit (CPU), and one or more memory controllers interconnected by a first local network on chip (NoC), the one or more memory controllers connected to one or more memory tiles on the second wafer, the AI accelerator logic tile further including a Peripheral Component Interconnect Express (PCIE) card configured to be pluggable via a connection to a host system;

a respective AI logic tile including a plurality of DPEs, a CPU, and one or more memory controllers interconnected by a second local NoC, the one or more memory controllers connected to one or more memory tiles on the second wafer; and a respective video logic tile including one or more video processing units, a CPU, and one or more memory controllers interconnected by a third local NoC, the one or more memory controllers connected to one or more memory tiles on the second wafer.

* * * * *